(12) United States Patent
Stadler

(10) Patent No.: US 7,630,782 B2
(45) Date of Patent: Dec. 8, 2009

(54) INK-JET POCKET PRINTING

(75) Inventor: Tobias Stadler, Regensburg (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 770 days.

(21) Appl. No.: 11/392,353

(22) Filed: Mar. 28, 2006

(65) Prior Publication Data
US 2006/0164445 A1    Jul. 27, 2006

Related U.S. Application Data

(62) Division of application No. 10/417,004, filed on Apr. 16, 2003, now Pat. No. 7,018,007.

(51) Int. Cl.
G06F 19/00   (2006.01)
B05D 5/06   (2006.01)
B41J 3/00   (2006.01)

(52) U.S. Cl. .................... 700/97; 427/162; 427/165

(58) Field of Classification Search .............. 347/2; 427/162, 165, 168; 700/97
See application file for complete search history.

(56) References Cited

U.S. PATENT DOCUMENTS

| | | | |
|---|---|---|---|
| 5,670,205 A | 9/1997 | Miyazaki et al. | |
| 5,822,207 A * | 10/1998 | Hazama et al. | 700/165 |
| 6,500,485 B1 | 12/2002 | Yamaguchi et al. | |
| 6,645,029 B2 | 11/2003 | Akahira | |

FOREIGN PATENT DOCUMENTS

EP    0 880 303 A1    11/1998

OTHER PUBLICATIONS

Donald J. Hayes, et al., Low-Cost Display Assembly and Interconnect Using Ink-Jet Printing Technology, Display Works '99, MicroFab Technologies, Inc., Plano TX.
T. R. Hebner, et al., Ink-Jet Printing of Doped Polymers for Organic Light Emitting Devices, Applied Physics Letters, Feb. 2, 1998, pp. 519-521, vol. 72, No. 5, American Institute of Physics,.
The Pioneer in Piezo Micro-Deposition, Jul. 30, 2002, Litrex Corporation, Pleasanton, CA.
Litrex Corporation's Mission is to Pioneer Inkjet Technology for Precision Manufacturing of Electronics and Electronic Displays and Become the World's Leading Manufacturer of Piezo Micro Deposition (PMD) Equipment, www.litrex.com/company/comp_data.htm, Litrex Corporation, Pleasanton, CA.
Litrex 80L IIJ System Software 2.2 Technical Bulletin, Nov. 22, 2002, Litrex Corporation, Pleasanton, CA.
Litrex 80L IIJ System Software 2.3.2 Technical Bulletin, Jan. 27, 2003, Litrex Corporation, Pleasanton, CA.

* cited by examiner

Primary Examiner—Julian D Huffman
(74) Attorney, Agent, or Firm—Fish & Richardson P.C.

(57) ABSTRACT

An embodiment of a computer-based method to graphically specify one or more encoder lines at which one or more nozzles of a print head is to release a droplet of an organic material includes:

(1) displaying on a display device a graphical pocket representation of a pocket, the graphical pocket representation includes one or more graphical encoder line where the one or more graphical encoder line corresponds to the one or more encoder step of the pocket;
(2) receiving a particular graphical encoder line where the received graphical encoder line is a subset of the one or more graphical encoder lines;
(3) displaying the graphical droplet at or erasing the graphical droplet from the particular received graphical encoder line; and
(4) generating one or more nozzle control values using the one or more received graphical encoder lines where the one or more nozzle control values specifies whether the corresponding nozzle releases the droplet of the organic material.

10 Claims, 13 Drawing Sheets

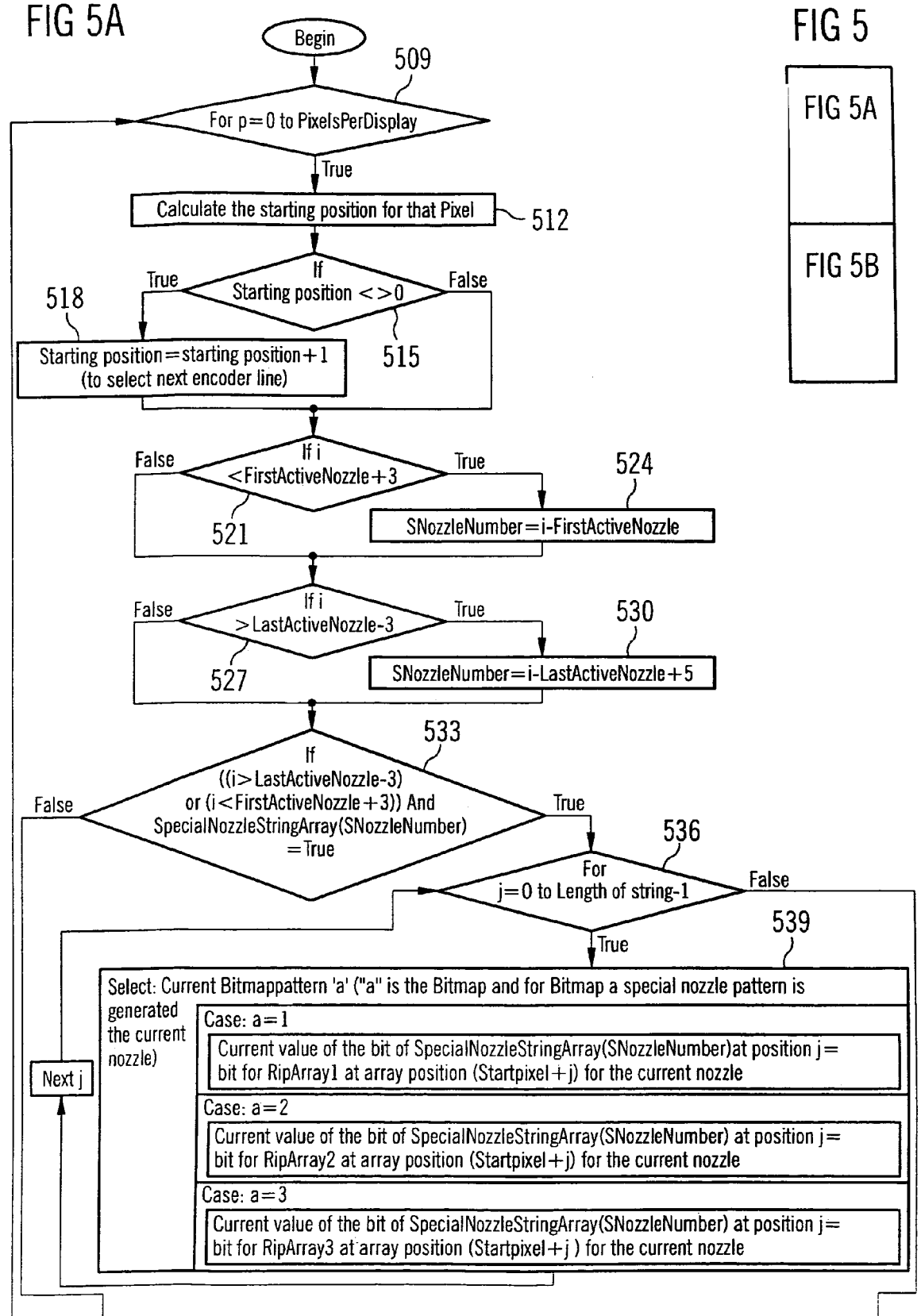

FIG 7

| | Line 1 | Line 2 | Line 3 | Line 4 | Line 5 | Line 6 | Line 7 | Line 8 | Line 9 | Line 10 | Line 11 | Line 12 | Line 13 | Line 14 | Line 15 | Line 16 | Line 17 | Line 18 | Line 19 | Line 20 | Line 21 | Line 22 | Line 23 | Line 24 | Line 25 | Line 26 | Line 27 | Line 28 | Line 29 | Line 30 | Line 31 | Line 32 | Line 33 | Line 34 | Line 35 | Line 36 | Line 37 | Line 38 | Line 39 | Line 40 | Line 41 | Line 42 | Line 43 | Line 44 | Line 45 | Line 46 | Line 47 | Line 48 | Line 49 | Line 50 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| 1st swath | 11 | 12 | 13 | 14 | 15 | | | | | | | | | | | | | | | | | | | | | | | | | | | | | | | | | | | | | | | | | | | | | |
| 2nd swath | 6 | 7 | 8 | 9 | 10 | 11 | 12 | 13 | 14 | 15 | | | | | | | | | | | | | | | | | | | | | | | | | | | | | | | | | | | | | | | | |
| 3rd swath | 1 | 2 | 3 | 4 | 5 | 6 | 7 | 8 | 9 | 10 | 11 | 12 | 13 | 14 | 15 | | | | | | | | | | | | | | | | | | | | | | | | | | | | | | | | | | | |
| 4th swath | | | | | | 1 | 2 | 3 | 4 | 5 | 6 | 7 | 8 | 9 | 10 | 11 | 12 | 13 | 14 | 15 | | | | | | | | | | | | | | | | | | | | | | | | | | | | | | |
| 5th swath | | | | | | | | | | | 1 | 2 | 3 | 4 | 5 | 6 | 7 | 8 | 9 | 10 | 11 | 12 | 13 | 14 | 15 | | | | | | | | | | | | | | | | | | | | | | | | | |
| 6th swath | | | | | | | | | | | | | | | | 1 | 2 | 3 | 4 | 5 | 6 | 7 | 8 | 9 | 10 | 11 | 12 | 13 | 14 | 15 | | | | | | | | | | | | | | | | | | | | |
| 7th swath | | | | | | | | | | | | | | | | | | | | | 1 | 2 | 3 | 4 | 5 | 6 | 7 | 8 | 9 | 10 | 11 | 12 | 13 | 14 | 15 | | | | | | | | | | | | | | | |
| 8th swath | | | | | | | | | | | | | | | | | | | | | | | | | | 1 | 2 | 3 | 4 | 5 | 6 | 7 | 8 | 9 | 10 | 11 | 12 | 13 | 14 | 15 | | | | | | | | | | |
| 9th swath | | | | | | | | | | | | | | | | | | | | | | | | | | | | | | | 1 | 2 | 3 | 4 | 5 | 6 | 7 | 8 | 9 | 10 | 11 | 12 | 13 | 14 | 15 | | | | |
| 10th swath | | | | | | | | | | | | | | | | | | | | | | | | | | | | | | | | | | | | 1 | 2 | 3 | 4 | 5 | 6 | 7 | 8 | 9 | 10 | 11 | 12 | 13 | 14 | 15 |
| 11th swath | | | | | | | | | | | | | | | | | | | | | | | | | | | | | | | | | | | | | | | | | 1 | 2 | 3 | 4 | 5 | 6 | 7 | 8 | 9 | 10 |
| 12th swath | | | | | | | | | | | | | | | | | | | | | | | | | | | | | | | | | | | | | | | | | | | | | | 1 | 2 | 3 | 4 | 5 |

Display with 50 lines

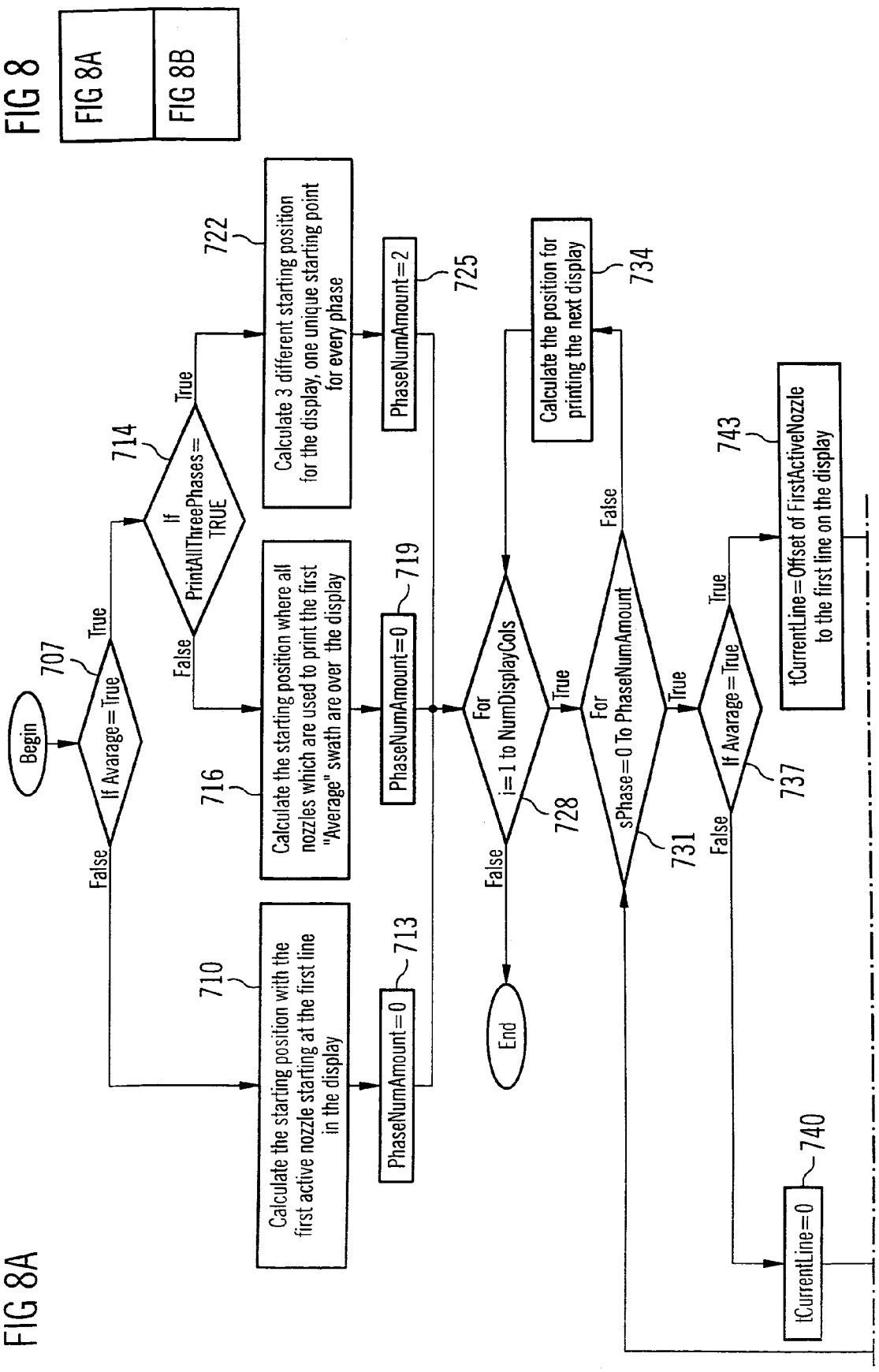

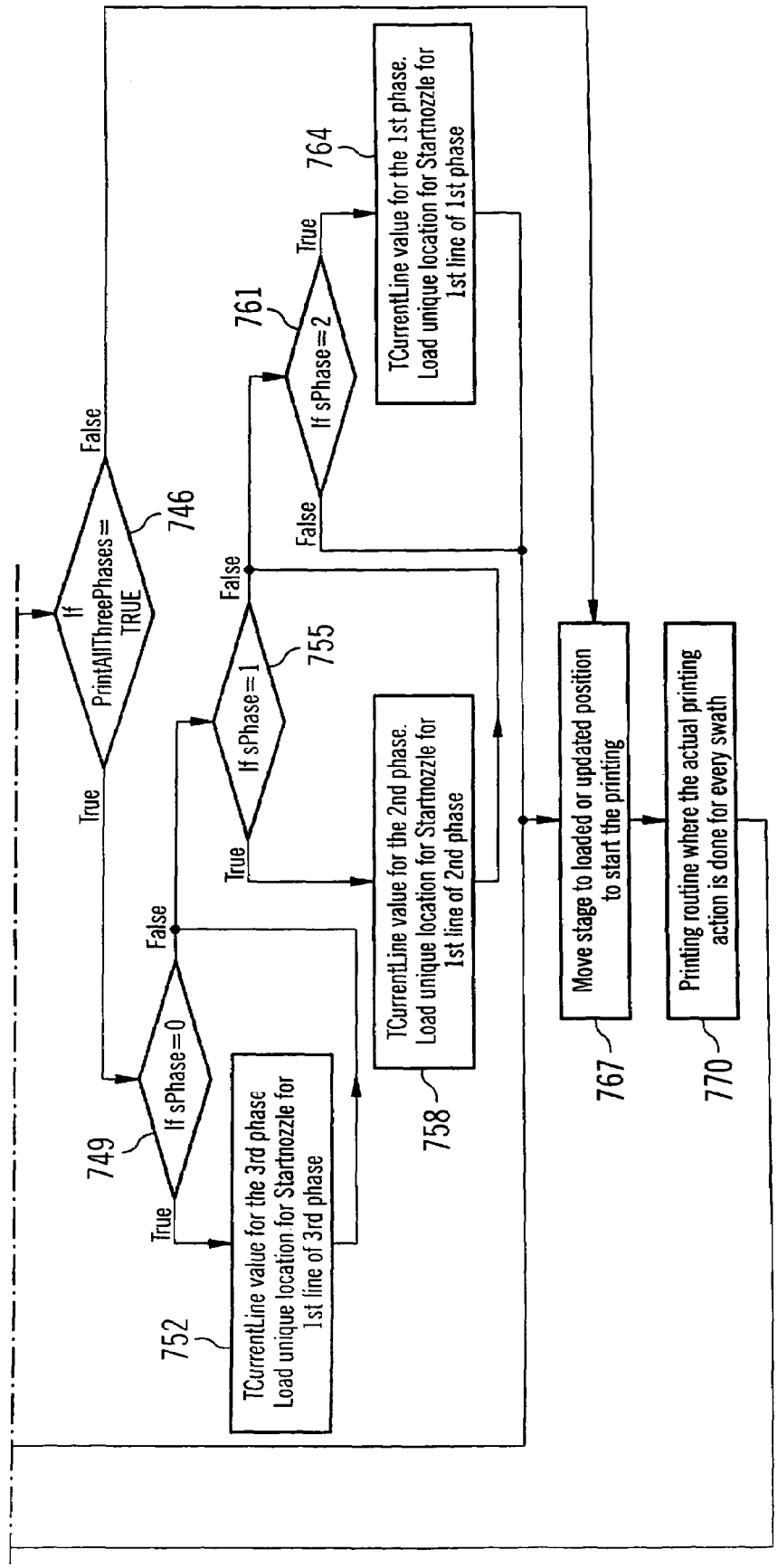

FIG. 9a

| Line | 1st Iteration | | | | | | 2nd Iteration | | | | | | 3rd Iteration | | | | | | Phase |
|---|---|---|---|---|---|---|---|---|---|---|---|---|---|---|---|---|---|---|---|
| Swath | 1st | 2nd | 3rd | 4th | 5th | 6th | 1st | 2nd | 3rd | 4th | 5th | 6th | 1st | 2nd | 3rd | 4th | 5th | 6th | |
| Line 50 | | | | | | | | 14 | 9 | 4 | | | | | | | | | Phase 2 |
| Line 49 | | | | | | | | | | | | | | | 12 | 7 | 2 | | Phase 1 |
| Line 48 | | 15 | 10 | 5 | | | | | | | | | | | | | | | Phase 3 |
| Line 47 | | | | | | | | 13 | 8 | 3 | | | | | | | | | Phase 2 |
| Line 46 | | | | | | | | | | | | | | | | 11 | 6 | 1 | Phase 1 |
| Line 45 | | 14 | 9 | 4 | | | | | | | | | | | | | | | Phase 3 |
| Line 44 | | | | | | | | 12 | 7 | 2 | | | | | | | | | Phase 2 |
| Line 43 | | | | | | | | | | | | | | | 15 | 10 | 5 | | Phase 1 |
| Line 42 | | 13 | 8 | 3 | | | | | | | | | | | | | | | Phase 3 |
| Line 41 | | | | | | | | 11 | 6 | 1 | | | | | | | | | Phase 2 |
| Line 40 | | | | | | | | | | | | | | | 14 | 9 | 4 | | Phase 1 |
| Line 39 | | 12 | 7 | 2 | | | | | | | | | | | | | | | Phase 3 |
| Line 38 | | | | | | | | 15 | 10 | 5 | | | | | | | | | Phase 2 |
| Line 37 | | | | | | | | | | | | | | | 13 | 8 | 3 | | Phase 1 |
| Line 36 | | 11 | 6 | 1 | | | | | | | | | | | | | | | Phase 3 |
| Line 35 | | | | | | | | 14 | 9 | 4 | | | | | | | | | Phase 2 |
| Line 34 | | | | | | | | | | | | | | | 12 | 7 | 2 | | Phase 1 |
| Line 33 | | 15 | 10 | 5 | | | | | | | | | | | | | | | Phase 3 |
| Line 32 | | | | | | | | 13 | 8 | 3 | | | | | | | | | Phase 2 |
| Line 31 | | | | | | | | | | | | | | | 11 | 6 | 1 | | Phase 1 |
| Line 30 | | 14 | 9 | 4 | | | | | | | | | | | | | | | Phase 3 |
| Line 29 | | | | | | | | 12 | 7 | 2 | | | | | | | | | Phase 2 |
| Line 28 | | | | | | | | | | | | | | 15 | 10 | 5 | | | Phase 1 |
| Line 27 | | 13 | 8 | 3 | | | | | | | | | | | | | | | Phase 3 |
| Line 26 | | | | | | | | 11 | 6 | 1 | | | | | | | | | Phase 2 |
| Line 25 | | | | | | | | | | | | | | 14 | 9 | 4 | | | Phase 1 |
| Line 24 | | 12 | 7 | 2 | | | | | | | | | | | | | | | Phase 3 |
| Line 23 | | | | | | | | 15 | 10 | 5 | | | | | | | | | Phase 2 |
| Line 22 | | | | | | | | | | | | | | 13 | 8 | 3 | | | Phase 1 |
| Line 21 | | 11 | 6 | 1 | | | | | | | | | | | | | | | Phase 3 |
| Line 20 | | | | | | | | 14 | 9 | 4 | | | | | | | | | Phase 2 |
| Line 19 | | | | | | | | | | | | | | 12 | 7 | 2 | | | Phase 1 |
| Line 18 | 15 | 10 | 5 | | | | | | | | | | | | | | | | Phase 3 |
| Line 17 | | | | | | | | 13 | 8 | 3 | | | | | | | | | Phase 2 |
| Line 16 | | | | | | | | | | | | | | | 11 | 6 | 1 | | Phase 1 |
| Line 15 | 14 | 9 | 4 | | | | | | | | | | | | | | | | Phase 3 |
| Line 14 | | | | | | | | 12 | 7 | 2 | | | | | | | | | Phase 2 |
| Line 13 | | | | | | | | | | | | | | 15 | 10 | 5 | | | Phase 1 |
| Line 12 | 13 | 8 | 3 | | | | | | | | | | | | | | | | Phase 3 |
| Line 11 | | | | | | | | 11 | 6 | 1 | | | | | | | | | Phase 2 |
| Line 10 | | | | | | | | | | | | | | 14 | 9 | 4 | | | Phase 1 |
| Line 9 | 12 | 7 | 2 | | | | | | | | | | | | | | | | Phase 3 |
| Line 8 | | | | | | | | 15 | 10 | 5 | | | | | | | | | Phase 2 |
| Line 7 | | | | | | | | | | | | | | 13 | 8 | 3 | | | Phase 1 |
| Line 6 | 11 | 6 | 1 | | | | | | | | | | | | | | | | Phase 3 |
| Line 5 | | | | | | | | 14 | 9 | 4 | | | | | | | | | Phase 2 |
| Line 4 | | | | | | | | | | | | | | 12 | 7 | 2 | | | Phase 1 |
| Line 3 | 15 | 10 | 5 | | | | | | | | | | | | | | | | Phase 3 |
| Line 2 | | | | | | | | 13 | 8 | 3 | | | | | | | | | Phase 2 |
| Line 1 | | | | | | | | | | | | | | 11 | 6 | 1 | | | Phase 1 |

FIG 9B

| Line | Col 1 | Col 2 | Col 3 | Col 4 | Col 5 |
|---|---|---|---|---|---|
| Line 1  | 11 | 6  | 1  |    |    |
| Line 2  | 13 | 8  | 3  |    |    |
| Line 3  | 15 | 10 | 5  |    |    |
| Line 4  | 12 | 7  | 2  |    |    |
| Line 5  | 14 | 9  | 4  |    |    |
| Line 6  | 11 | 6  | 1  |    |    |
| Line 7  | 13 | 8  | 3  |    |    |
| Line 8  | 15 | 10 | 5  |    |    |
| Line 9  | 12 | 7  | 2  |    |    |
| Line 10 | 14 | 9  | 4  |    |    |
| Line 11 | 11 | 6  | 1  |    |    |
| Line 12 | 13 | 8  | 3  |    |    |
| Line 13 | 15 | 10 | 5  |    |    |
| Line 14 | 12 | 7  | 2  |    |    |
| Line 15 | 14 | 9  | 4  |    |    |
| Line 16 |    | 11 | 6  | 1  |    |
| Line 17 |    | 13 | 8  | 3  |    |
| Line 18 |    | 15 | 10 | 5  |    |
| Line 19 |    | 12 | 7  | 2  |    |
| Line 20 |    | 14 | 9  | 4  |    |
| Line 21 |    | 11 | 6  | 1  |    |
| Line 22 |    | 13 | 8  | 3  |    |
| Line 23 |    | 15 | 10 | 5  |    |
| Line 24 |    | 12 | 7  | 2  |    |
| Line 25 |    | 14 | 9  | 4  |    |
| Line 26 |    | 11 | 6  | 1  |    |
| Line 27 |    | 13 | 8  | 3  |    |
| Line 28 |    | 15 | 10 | 5  |    |
| Line 29 |    | 12 | 7  | 2  |    |
| Line 30 |    | 14 | 9  | 4  |    |
| Line 31 |    |    | 11 | 6  | 1  |
| Line 32 |    |    | 13 | 8  | 3  |
| Line 33 |    |    | 15 | 10 | 5  |
| Line 34 |    |    | 12 | 7  | 2  |
| Line 35 |    |    | 14 | 9  | 4  |
| Line 36 |    |    | 11 | 6  | 1  |
| Line 37 |    |    | 13 | 8  | 3  |
| Line 38 |    |    | 15 | 10 | 5  |
| Line 39 |    |    | 12 | 7  | 2  |
| Line 40 |    |    | 14 | 9  | 4  |
| Line 41 |    |    | 11 | 6  | 1  |
| Line 42 |    |    | 13 | 8  | 3  |
| Line 43 |    |    | 15 | 10 | 5  |
| Line 44 |    |    | 12 | 7  | 2  |
| Line 45 |    |    | 14 | 9  | 4  |
| Line 46 |    |    | 11 | 6  | 1  |
| Line 47 |    |    | 13 | 8  | 3  |
| Line 48 |    |    | 15 | 10 | 5  |
| Line 49 |    |    | 12 | 7  | 2  |
| Line 50 |    |    | 14 | 9  | 4  |

INK-JET POCKET PRINTING

CROSS-REFERENCE TO RELATED APPLICATIONS

This application is a divisional application and claims the benefit of priority under 35 U.S.C. Section 120 of U.S. application Ser. No. 10/417,004, filed Apr. 16, 2003 now U.S. Pat. No. 7,018,007. The disclosure of the prior application is considered part of and is incorporated by reference in the disclosure of this application.

BACKGROUND OF THE INVENTION

There is increased interest in light emitting diode displays made from organic materials because of their relatively low cost, ability to emit light, low power consumption, low driving voltages, ability to view the image at 180 degree angles, and good color tenability that allows them to be used in full color displays. The organic materials are deposited by, for example, spin-coating or ink-jet printing (in the case of polymer materials), or by evaporation (in the case of small organic molecules). Ink-jet printing is becoming an increasingly attractive organic material dispensing technique as displays are moving toward color displays and display manufacturing technologies are being driven toward further automation, miniaturization, and reductions in costs, cycle times, and environmental impact. Advantages offered by ink-jet printing include low-cost, precise control of dispensed volumes, data-driven deposition, and environmental friendliness.

Ink-jet printing systems are used to manufacture organic light emitting diode displays. With these ink-jet printing systems, the positions within a pocket at which a droplet of an organic material is to be released from one or more nozzles of a print head is specified by writing in a file the distances (e.g., in millimeters) from the center of the pocket at which the droplet of the organic material is to be released. Specifying the distance from the center can be time consuming, can be cumbersome, and can be inaccurate due to human error. Also, by merely specifying distances from the center at which droplets of organic material are to be released, a user is not given a preview of an approximation as to how the specified droplets will fill the pocket and whether, for example, the droplets will overflow the pocket or will be evenly distributed within the pocket. By not providing this preview to the user, the user will have more difficulties in choosing the best printing pattern and the locations at which the droplets are released in order to improve efficiency, lifetime, and printability. By having to perform the time consuming task of measuring and specifying the distances from center, more time is needed to change and create a new printing pattern for testing.

With typical ink-jet printing systems, adjacent nozzles do not deposit organic material in pockets of corresponding adjacent lines of the display (e.g., nozzle 1 does not deposit organic material into a pocket in line 1 and nozzle 2 does not deposit organic material into a pocket in line 2) because the strong rotation of the print head needed to fill these pockets can lead to errors such as droplets being deposited outside the pocket boundary. After the first print cycle (e.g., after the first print phase), these ink-jet printing systems come to a halt. The operator typically has to manually instruct these ink-jet printing systems to perform one or more additional cycles (i.e., perform additional print phases) so that all of the pockets of the display are printed. Manually performing this printing process makes this a time consuming and operator-intensive task. In addition, with these ink-jet printing systems, the adjacent lines are typically printed using the same nozzle. For example, to print a polyethylenedioxythiophene ("PEDOT") layer, three print cycles (i.e., phases) are needed to print groups of three adjacent lines because of the angle error resulting from the rotation of the print head as described earlier. When employing this process of using three print cycles to print the display, each group of three adjacent lines are printed using the same nozzle. Since each of the lines in the group are printed using the same nozzle, the lines having the same concentrations of organic material are grouped together. This grouping results in more noticeable differences in the brightness of the display at, for example, the boundaries of the groups. In this case, the differences (i.e., errors) in the concentrations of the lines are not randomly dispersed.

With the typical ink-jet printing systems, during a single print cycle, two or more different nozzles cannot be used to release droplets of organic material into the same pocket of a particular line. This can result in large differences between lines as to the amount of organic material contained in the pockets of the lines due to differences in the amount of organic material released by different nozzles. For example, if the first nozzle of the print head releases 1.2 picoliters and the fifth nozzle of the print head releases 0.8 picoliters, then the pockets filled with either of these nozzles contain 1.2 picoliters or 0.8 picoliters of organic material. This difference in the amounts of organic material deposited results in, for example, decreased display quality because the pixels (i.e., pockets) are not emitting at uniform brightness. Also, the pixels containing lesser amounts of organic material generally have a shorter lifetime. With these ink-jet printing systems, the pockets of a particular line can be printed by two or more different nozzles only by reprinting on the same display after the first print iteration completed. But by the time the display is ready for reprinting, the organic materials deposited by the previous print iteration have already dried, resulting in the droplets deposited by the current iteration forming a new layer rather than combining with the droplets deposited from the previous print iterations to form homogeneous films at the pockets.

For the foregoing reasons, there exists a need to accurately, quickly, and conveniently specify the encoder steps at which droplets of an organic material are to be deposited from the nozzles of the print head. Also, there exits a need to quickly and efficiently print all the pockets of the display and print the pockets such that adjacent lines within the set are printed using different nozzles. There also exists a need to deposit droplets of an organic material from two or more different nozzles into a single pocket during one print iteration.

SUMMARY

An embodiment of a computer-based method to graphically specify at least one encoder line of each at least one pocket at which at least one nozzle of a print head is to release a droplet of an organic material includes:

(1) displaying on a display device a graphical pocket representation of a particular one of the at least one pocket, the graphical pocket representation includes at least one graphical encoder line where the at least one graphical encoder line corresponds to the at least one encoder step of the particular pocket;

(2) receiving a particular one of at least one received graphical encoder line where the at least one received graphical encoder line is a subset of the at least one graphical encoder line;

(3) displaying the graphical droplet at or erasing the graphical droplet from the particular received graphical encoder line; and (4) generating at least one nozzle control value using the at least one received graphical encoder line where the at least one nozzle control value specifies whether the corresponding at least one nozzle releases the droplet of the organic material.

An embodiment of a computer-based method to control multiple nozzles of a print head to more uniformly print multiple lines of a display includes:

(1) grouping the multiple nozzles to form multiple effective groups of nozzles;

(2) printing a subset of the multiple lines using a first one of the multiple effective groups of nozzles; and (3) reprinting the subset of the multiple lines using a second one of the multiple effective groups of nozzles, where the nozzles of the first one of the multiple effective groups of nozzles are different than nozzles of the second one of the multiple effective groups of nozzles.

Another embodiment of a computer-based method to control multiple nozzles of a print head to more uniformly print multiple lines of a display on a substrate includes:

(1) grouping said multiple nozzles to form multiple effective groups of nozzles;

(2) calculating a starting position of a first one of the multiple lines;

(3) moving the display to the starting position; and for a particular one of multiple swathes:

(4) calculating a number to deactivate some of said plurality of effective groups of nozzles that are to be deactivated during said particular swath;

(5) deactivating some of the effective groups of nozzles;

(6) activating all other of the effective groups of nozzles that are within boundaries of the display;

(7) printing a subset of the multiple lines using a particular one of the multiple effective groups of nozzles that are activated;

(8) calculating a distance to another starting position so that the subset of the plurality of lines are printed using a different one of the effective groups of nozzles that are activated during a next one of the multiple swathes; and (9) moving said display to the other starting position.

Yet another embodiment of a computer-based method to control multiple nozzles of a print head to more uniformly print multiple lines of a display includes:

(1) grouping the multiple nozzles to form multiple effective groups of nozzles;

(2) during a first print phase, printing a first one of multiple first phase lines using a first one of a particular one of the multiple effective groups of nozzles; and (3) during a second print phase, printing a first one of multiple second phase lines using a second one of the particular one of the multiple effective groups of nozzles, where the multiple first phase lines are a subset of the multiple lines and the multiple second phase lines are a different subset of the multiple lines, and where the multiple nozzles print the multiple first phase lines during the first print phase and the multiple nozzles print the multiple second phase lines during the second print phase, and where the first one of the multiple first phase lines is adjacent to the first one of the multiple second phase lines.

BRIEF DESCRIPTION OF THE DRAWINGS

FIG. 7 shows an example of printing a display using averaging according to an embodiment of the present invention.

FIG. 8 shows an embodiment of a process for three-phase printing according to the present invention.

FIGS. 9a-b shows an example of printing a display using three-phase printing according to an embodiment of the present invention.

DETAILED DESCRIPTION

Figure 1:
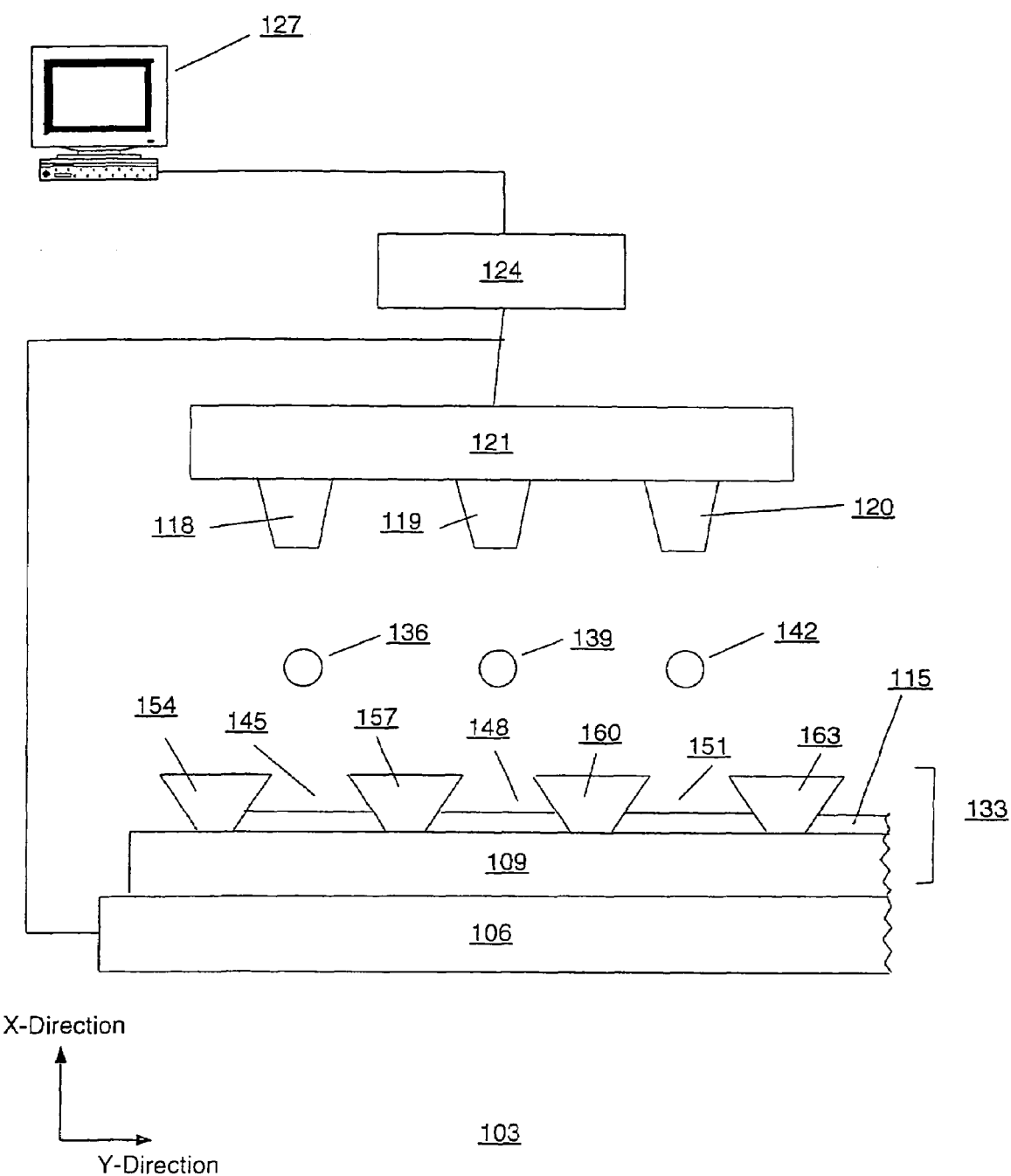
FIG. 1 shows an ink-jet printing system.

FIG. 1 shows an ink-jet printing system 103. The ink-jet printing system 103 includes a x-y stage 106 on which the to be manufactured display 133 is placed (in FIG. 1, only a portion of the display 133 is shown). The x-y stage 106 moves both in the x-direction and the y-direction and is used to accurately position the to be manufactured display 133 under a print head 121. The display 133 includes a substrate 109 that is made of, for example, glass or plastic. On the substrate 109 are resists 154, 157, 160, 163 that are used to physically divide each of the lines 145, 148, 151. Also on the substrate 109 is a patterned electrode 115 made of, for example, indium tin oxide ("ITO") and/or other electronics used for active matrix displays. The print head 121 includes a first nozzle 118, a second nozzle 119, and a third nozzle 120. The first nozzle 118, the second nozzle 119, and the third nozzle 120 release corresponding droplets of organic material 136, 139, 142 to the corresponding first line 145, second line 148, and third line 151. The organic material released can be, for example, a conducting polymer such as polyaniline ("PANI") or polyethylenedioxythiophene ("PEDOT"), or an emissive polymer such as polyphenylenevinylene ("PPV") or polyfluorene ("PF").

An operator station 127 provides an interface between the operator and the ink-jet printing system. The operator station 127 allows the operator to graphically specify, for example, the physical boundaries of the display 133, the printing pattern for the pockets, and the starting position for each swath. The operator station 127 is coupled to a driver 124. The driver 124 is coupled to the print head 121 and the x-y stage 106. The operator's specifications and instructions are processed by a computer program executing on the operator station 127 and the computer program instructs the driver 124 to control the print head 121 and the x-y stage 106 so as to operate as instructed by the operator. For example, the driver 124 rotates the print head 121 so that the nozzles 118, 119, 120 are aligned with the lines that are to be printed as specified by the operator. The nozzles 118, 119, 120 of the print head 121 release droplets of organic material into the pockets of the lines so as to form the print pattern specified by the user. A setup file residing at the operator station 127 and configurable by the operator stores the substrate geometry, the display dimensions, maintenance intervals, and hardware specific parameters. Optical recognition software running at the operator station 127 perform automatic alignment of the substrate and inspects the droplets fired by the print head nozzles. The software determines the location of a first pocket in relation to the first nozzle (e.g., nozzle 118). Control software running at the operator station 127 instruct the print head 121 and the x-y stage 106 via the driver 124 to move such that adjacent lines printed during different phases are printed with different nozzles. Control software running at the operator station 127 also instruct the print head 121 and the x-y stage 106 via the driver 124 to move such that each of the lines 145, 148, 151 are printed with two or more different nozzles 118, 119, 120.

Figure 2:
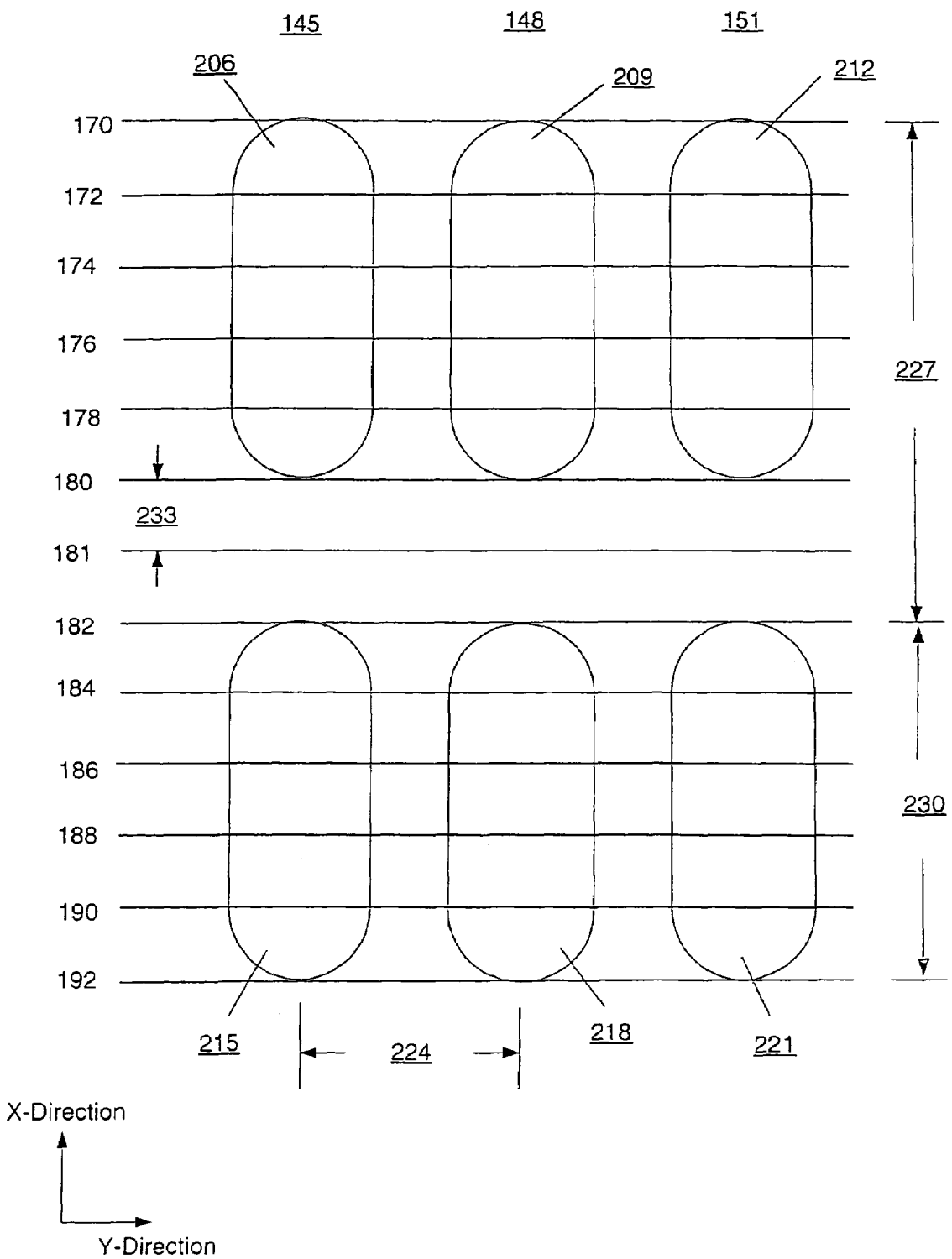
FIG. 2 shows a top-view of the lines of the display.

FIG. 2 shows a top-view of the lines 145, 148, 151 of the display 133. Each of these lines includes one or more pockets. Each of these pockets is a pixel of the display 133. Line 145 includes a pocket 206 and a pocket 215. Line 148 includes a pocket 209 and a pocket 218. Line 151 includes a pocket 212 and a pocket 221. Encoder steps 170-192 provide reference points on the display 133 to indicate when particular positions of the pockets have been reached so that nozzles 118, 119, 120 release droplets of organic material to produce the print pattern graphically specified by the operator.

An encoder divider distance 233 is the distance between two adjacent encoder steps (e.g., the distance between an encoder step 180 and an encoder step 181). Each encoder step is one trigger point (i.e., trigger pulse). The trigger points are on the x-y stage 106 and are used to indicate how much the motor has moved the x-y stage 106 in either the x-direction or the y-direction. A line pitch 224 is the horizontal distance between the centers of two adjacent pockets (e.g., the distance between the adjacent pockets 215, 218). A pixel pitch 227 is the vertical distance between the start of one pocket and the start of another adjacent pocket (e.g., the distance between the start of the pocket 212 and the start of the pocket 221). A pixel length 230 is the vertical distance from the start of one pocket and the end of the same pocket (e.g., the distance between the start of pocket 221 and the end of the pocket 221). An effective number of nozzles is the number of nozzles on the print head 121 that print into empty lines at each swath. One swath is the movement of the print head 121 from the start of the lines printed (e.g., the starting point is the first pocket of those lines) to the end of those lines (e.g., the ending point is the last pocket of the lines printed). The row pitch is a multiple of the line pitch (for example, in the case of color printing, the row pitch is the distance between the first line and the fourth line), and the distance in the y-direction that the print head 121 moves to begin the next swath is the row pitch multiplied with the effective number of nozzles. The difference between real and effective number of nozzles is that the real number of nozzles is the number of all active nozzles, and the effective number of nozzles is the number of nozzles that print into empty lines during a first swath.

I. Bitmap Pocket Printing

Figure 3:
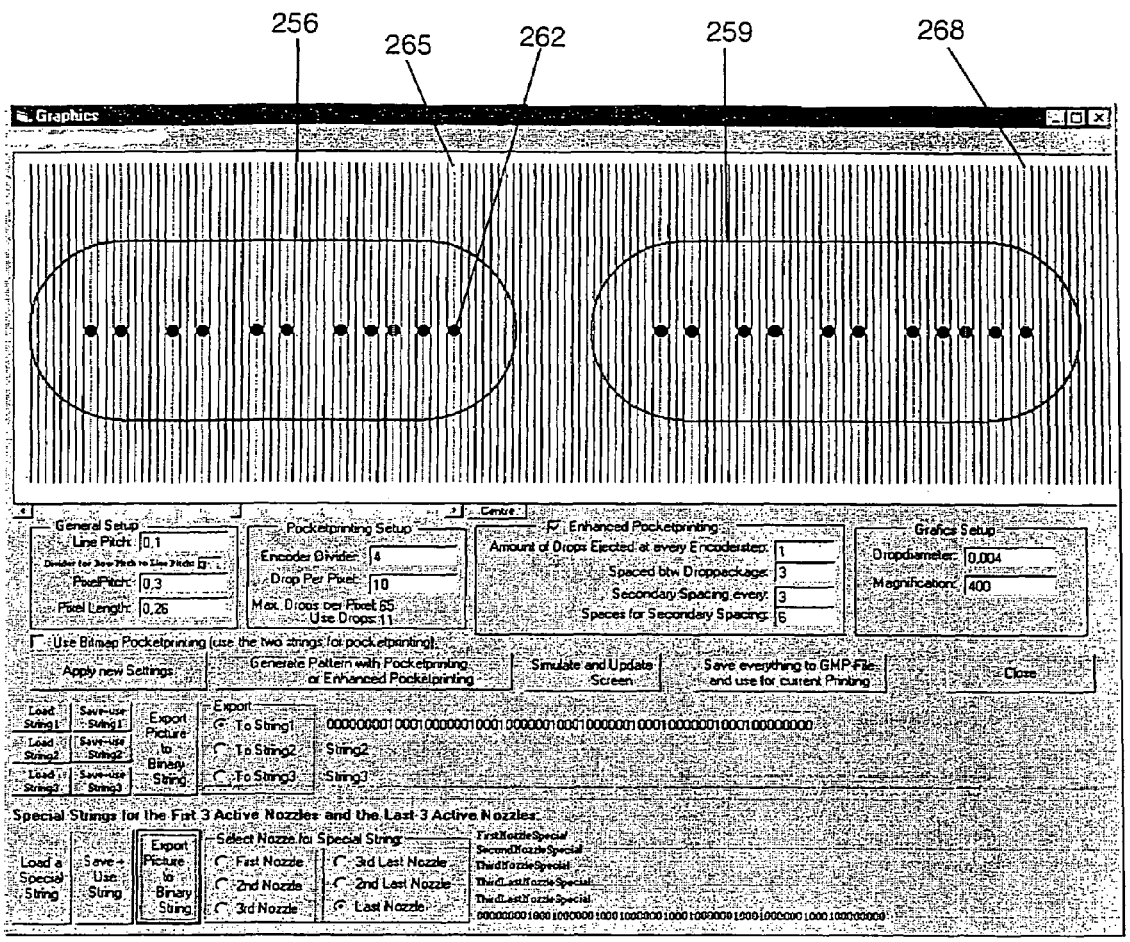
FIG. 3 shows an embodiment of a pocket printing graphical interface according to the present invention.

FIG. 3 shows an embodiment of a pocket printing graphical interface 253 according to the present invention. This interface is shown on a display device of the operator station 127 of the ink jet printing system 103. The display device is, for example, a cathode ray tube ("CRT")-based display or a flat-panel display. In FIG. 3, a graphical pocket representation 256 represents one of the pockets within one of the lines of the display 133 (e.g., the graphical pocket representation 256 represents the pocket 206 within the line 145 of the display 133). Graphical encoder lines (e.g., the graphical encoder lines 265) represent the encoder steps (e.g., the encoder steps 170-192) on the display 133. When an operator makes a selection close to one of the graphical encoder lines, then if a graphical droplet 262 is not shown at the selected graphical encoder line (i.e., if the graphical droplet 262 is not shown then this indicates that prior to this selection, a droplet of organic material was not to be released at this encoder step), then the graphical droplet 262 is displayed at the selected graphical encoder line. If a graphical droplet 262 is already shown at the selected graphical encoder line (i.e., if the graphical droplet 262 is already shown then this indicates that prior to this selection, a droplet of organic material was to be released at this encoder step), then the graphical droplet 262 is erased from the selected graphical encoder line. The graphical droplets 262 represent droplets of organic material. In one configuration of this embodiment, the selection is considered close to a particular graphical encoder line if a coordinate of the selection is within approximately 0.4 millimeters from the particular graphical encoder line 265.

In one configuration of this embodiment, a second graphical pocket representation 259 is displayed in addition to the graphical pocket representation 256. The graphical pocket representation 259 represents another pixel on the same line as the graphical pocket representation 256. The graphical pocket representation 259 has the same geometry and dimensions as the graphical pocket representation 256. Selections made on the graphical pocket representation 256 are mirrored on the graphical pocket representation 259. For example, if a selection is made close to a particular one of the graphical encoder lines 265 of the graphical pocket representation 256 and the graphical droplet 262 is not already shown at the selected graphical encoder line 265, then the graphical droplet 262 is shown at the selected graphical encoder line 265, and in addition the graphical droplet 262 is also shown at the corresponding graphical encoder line of the graphical pocket representation 259.

The pocket printing graphical interface 253 also includes multiple fields that allow the operator to specify the properties of, for example, the graphical pocket representation 256, the graphical droplets 262, and the graphical encoder lines 265. The fields include a "Line Pitch" field to specify the line pitch 224 (shown in FIG. 2); an "Encoder Divider" field to specify the number of encoder steps per millimeter (this field can be used to change the encoder divider distance 233); "Divider for Row Pitch to Line Pitch" field to specify the number of line pitches per row pitch; a "Pixel Pitch" field to specify the pixel pitch 227; a "Pixel Length" field to specify the pixel length 230; a "Use Drops" field that shows the current number of graphical droplets in a graphical pocket representation; a "Max Drops per Pixel" field shows the maximum number of drops per pixel given the value specified by the "Encoder Divider" field (the maximum number of drops is the number of graphical encoder lines in a graphical pocket representation); and a "Drop Per Pixel" field specifies the number of drops generated when pressing the "Generate Pattern with Pocket Printing or Enhanced Pocket Printing" button. Selection of this button quickly generates a droplet pattern without having to draw every droplet. These generated patterns can be edited in the graphical pocket representation.

The enhanced pocket printing section contains the fields that are used to vary the look of the pattern generated when selecting the "Generate Pattern with Pocket Printing or Enhanced Pocket Printing" button. If enhanced pocket printing is to be enabled, then the "Enhanced Pocket Printing" field is checked. The "Amount of Drops Ejected at Every Encoder Step" field specifies the number of droplets that will be generated in succession. The "Space Between Drop Package" field specifies the number of encoder steps (i.e., space) between adjacent droplets. The "Secondary Spacing Every" field specifies the number of encoder lines within the pocket that are traversed until the number of encoder lines specified by the "Spaces for Secondary Spacing" field is inserted in the pattern.

The "Dropdiameter" field specifies the diameter of the graphical droplet 262 in millimeters. The "Magnification" field specifies the magnitude of the magnification of the graphical pocket representation, the graphical droplet, and the graphical encoder lines from the actual size of the pixels, droplets of organic material, and encoder steps.

If the "Use Bitmap Pocket Printing" field is checked, then the pattern specified by the operator using the graphical interface 253 is printed in the pocket. Selection of the "Apply New Settings" button erases the graphical pocket representation and the graphical droplet pattern displayed on the screen and redraws a graphical pocket representation and a graphical droplet pattern using the current/modified values for the "Line Pitch" field, the "Pixel Pitch" field, the "Pixel Length" field, the "Encoder Divider" field, and the "Magnification" field. Selection of the "Generate Pattern with Pocket Printing or Enhanced Pocket Printing" button generates a graphical pattern to quickly change and create a new pattern that can be edited. Selection of the "Simulate and Update Screen" button redraws the graphical droplets if the value in the "Drop diameter" field was modified. Selection of the "Save Everything to GMP-File and Use for Current Printing" button saves the values in the fields to the setup file and transfers the values to the printing program. Selection of the "Close" button closes the window.

When performing "averaging" ("averaging" is discussed below), different effective groups of nozzles can have different print patterns and these different print patterns are specified, for example, in "string 1", "string 2", or "string 3". "String 1" contains the common print pattern for the first effective group of nozzles; "string 2" contains the common print pattern for the second effective group of nozzles; and "string 3" contains the common print pattern for the third and all further effective group of nozzles. Selection of the "Load String 1", "Load String 2", or "Load String 3" button loads an earlier saved print pattern. Selection of the "Save+Use String 1" button, the "Save+Use String 2" button, or the "Save+Use String 3" button saves the current print pattern shown next to this button to one of string 1, string 2, or string 3. Selection of the "Export Picture to Binary String" button converts the print pattern displayed on the graphical pocket representation 256 to a binary string. The binary string generated is shown next to any one of the "Save+Use String 1" button, the "Save+Use String 2" button, or the "Save+Use String 3" depending on the specification within the "Export" field.

The pocket printing graphical interface 253 allows a special pattern to be printed from the first three nozzles of the print head 121 and the last three nozzles of the print head 121. Selection of the "Load a Special String" button loads an earlier saved print pattern. Selection of the "Save+Use String" button saves the current print pattern shown in the lower right corner of the window ordered from the first active nozzle to the last active nozzle. Selection of the "Export Picture to Binary String" button converts the print pattern for the graphical pocket representation 256 to a binary string and assigns it to either one of the first three nozzles of the print head 121 or the last three nozzles of the print head 121 as specified by the "Select Nozzle for Special String" field.

Figure 4:
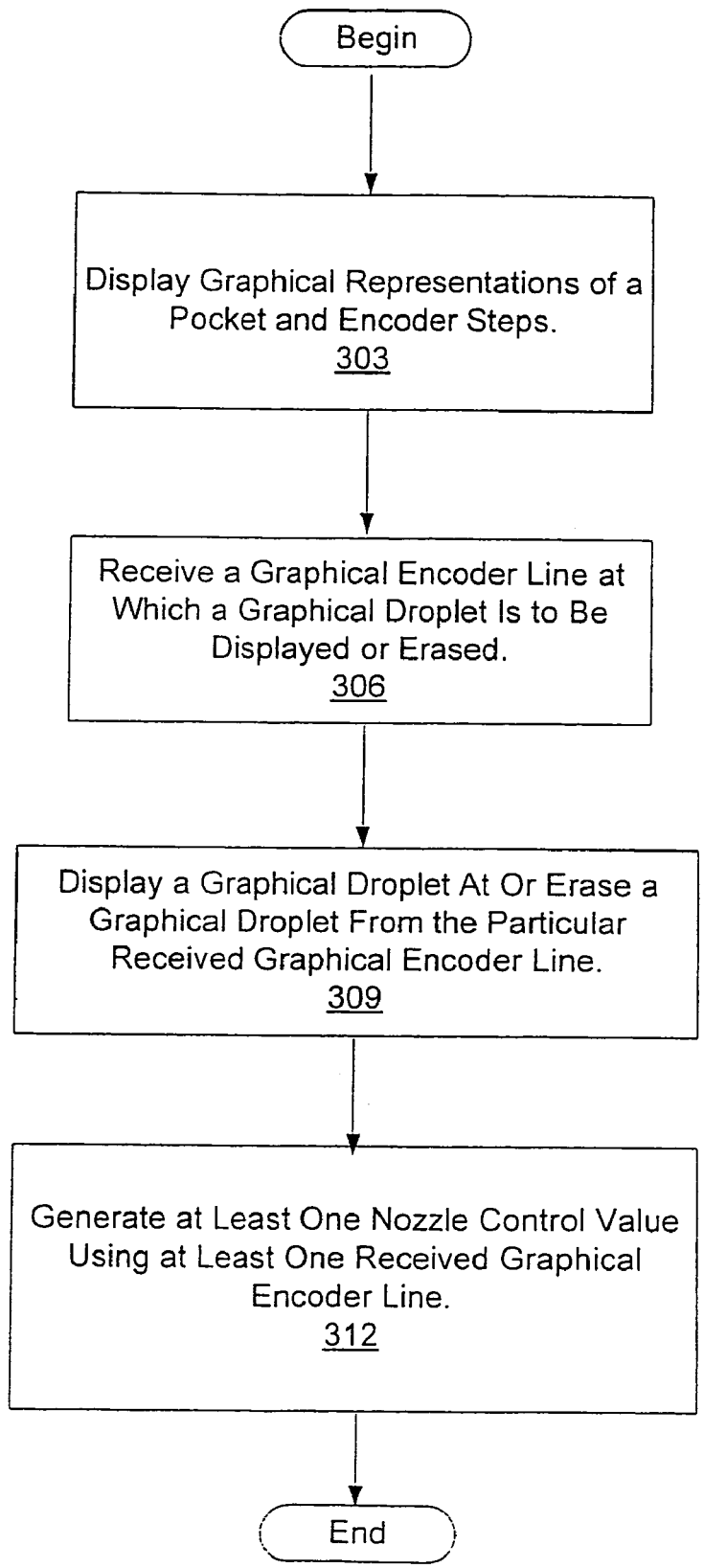
FIG. 4 shows an embodiment of a process to graphically specify the encoder steps within a pocket at which a droplet of an organic material is to be released.

FIG. 4 shows an embodiment of a process to graphically specify the encoder steps within a pocket at which a droplet of an organic material is to be released. In block 303, a graphical representation of a pocket and the encoder steps are displayed on the display device of the operator station 127. For example, the graphical representation of the pocket 206 is the graphical pocket representation 256 and the graphical representation of the encoder steps 170-180 is the graphical encoder lines within the graphical pocket representation 256 (one example of a graphical encoder line is the graphical encoder line 265). In one configuration of this embodiment, the graphical pocket representation 256 is displayed by drawing a first circle in which the left-most point on the circumference of the first circle is at a starting point. The diameter of the first circle is the line pitch 244 (e.g., the diameter is specified by the value in the "Line Pitch" field). Then, a first horizontal line is drawn in which one end of this line is at the top-most point on the circumference of the first circle. The length of the first horizontal line is: the pixel length (e.g., the value specified in the "Pixel Length" field) minus the line pitch (e.g., the value specified in the "Line Pitch" field). Then, a second horizontal line is drawn from the bottom-most point on the circumference of the first circle. The length of the second horizontal line is also: the pixel length minus the line pitch. A second circle is drawn in which the right-most point on a circumference of the second circle is a pixel length away from the left-most point on a circumference of the first circle. The diameter of the second circle is the line pitch 244. The other end of the first horizontal line is connected to a top-most point on the circumference of the second circle, and the other end of the second horizontal line is connected to a bottom-most point on the circumference of the second circle. A closed geometrical figure that is filled with the same color as the background color is placed so as to cover the inner half of the first circle and the inner half of the second circle. The closed geometrical figure can be, for example, a square or a rectangle.

In one configuration of this embodiment, only one graphical pocket representation 256 is drawn but in another configuration of this embodiment, another graphical pocket representation 259 is drawn so that two graphical pocket representations are displayed on the display of the operator station 127. The graphical pocket representation 259 is drawn using the same process as that used to draw the graphical pocket representation 256. The left-most point on the circumference of the first circle of the graphical pocket representation 259 is a pixel pitch 227 distance away from the starting point of the graphical pocket representation 256 (e.g., this starting point is the left-most point on the circumference of the first circle of the graphical pocket representation 256; also, e.g., the pixel pitch 227 is specified by the value in the "Pixel Pitch" field). After the first circle is drawn, then the two horizontal lines are drawn, followed by the second circle and then the closed geometrical figure that is used to cover the inner half of the first circle and the inner half of the second circle.

Graphical encoder lines are drawn on the display relative to the graphical pocket representation 256. The graphical encoder lines are vertical lines and the first graphical encoder line is drawn at the starting point of the graphical pocket representation 256. Succeeding graphical encoder lines are drawn such that they are the encoder divider distance 233 away from each other. The encoder divider distance 233 is determined by using the following formula: "encoder divider distance" ="encoder resolution"/"encoder steps per millimeter", where "encoder steps per millimeter" is specified by the "Encoder Divider" field. The "encoder resolution" is the resolution between encoder pulses on the x-y stage 106.

The remaining objects of the graphical interface 253 (e.g., the borders, the buttons (e.g., the "Apply New Settings" button and the "Load String 1" button) and the fields (e.g., the "Line Pitch" field and the "Encoder Divider" field)) are drawn using development tools such as Visual Basic and Visual C from Microsoft Corporation of Redmond, Washington.

In block 306, a graphical encoder line is received at which the operator wants to display a graphical droplet or from which the operator wants to erase an already existing graphical droplet. Upon receiving a selection at a particular coordinate point, it is determined if the selected coordinate point is close to any one of the graphical encoder lines of the graphical pocket representation 256. For example, if the selected coordinate point is within approximately 0.4 millimeters from one of the graphical encoder lines, then the selected coordinate point can be considered close to that graphical encoder line. If the selected coordinate point is close to any one of the graphical encoder lines, then it is determined if a graphical droplet should be displayed at or erased from this close graphical encoder line (i.e., this close graphical encoder line is referred to as the received graphical encoder line). If the graphical droplet is not present at the received graphical encoder line, then the graphical droplet should be displayed at the received graphical encoder line. If, however, the graphical droplet is present at the received graphical encoder line, then the graphical droplet should be erased from the received graphical encoder line. In one configuration of this embodiment, determining if a graphical droplet is to be displayed or erased occurs by checking the current value of an array of bits. Each of the array of bits corresponds to one of the graphical encoder lines within the graphical pocket representation and each bit specifies whether the corresponding graphical encoder line has a graphical droplet displayed at that line (e.g., if the bit corresponding to the received graphical encoder line is set to "1", then a graphical droplet should be displayed at this line, otherwise, if that bit is set to "0", then a graphical droplet should not be displayed at that line). If the bit corresponding to the received graphical encoder line specifies that a graphical droplet is not to be displayed at this line, then the graphical droplet should be drawn at this line and so this bit is toggled to specify that the graphical droplet is to be displayed at this line. If, however, the bit corresponding to the received graphical encoder line specifies that a graphical droplet is to be displayed at this line, then the graphical droplet should be erased from this line and so this bit is toggled to specify that the graphical droplet is not to be displayed at this line.

In block 309, the graphical droplet is displayed at the particular received graphical encoder line or erased from the particular received graphical encoder line. In one configuration of this embodiment, if the bit corresponding to the received graphical encoder line specifies that the graphical droplet is to be displayed at this line, then a circle is drawn at the received graphical encoder line; this circle has the diameter specified by the "Drop Diameter" field and a center at the received graphical encoder line. In addition, this received graphical encoder line can be highlighted by, for example, coloring that line a different color than the lines that do not have a graphical droplet. If, however, the bit corresponding to the received graphical encoder line specifies that the graphical droplet is not to be displayed at this line (i.e., the graphical droplet is to be erased from this line), then the received graphical encoder line is redrawn without a circle on it.

If another graphical pocket representations is shown on the display of the operator station 127 (e.g., the graphical pocket representation 259 is also shown on the display), then when a graphical droplet is displayed at or erased from the received graphical encoder line of one pocket, then the graphical droplet is displayed at or erased from a corresponding graphical encoder line at the other pocket. For example, if a graphical droplet 262 is displayed on the graphical encoder line 265, then a graphical droplet is also displayed on the corresponding graphical encoder line 268.

In block 312, nozzle control values are generated using the received graphical encoder lines; the nozzle control values specify whether corresponding nozzles release a droplet of organic material. In one configuration of this embodiment, the nozzle control values are generated when, for example, the operator selects the "Export Picture to Binary String" button and then selects the "Save and Use String" button to pass the values to the print head 121. At each swath, the starting positions for the active nozzles of the print head 121 are provided to the print head. The starting position for each pocket is the first encoder step within that pocket. Also, at each swath, nozzle control values are sent to the print head to instruct each of the active nozzles whether to release a droplet of organic material at a specific encoder step. If specific print patterns have been specified for the first three nozzles and/or the last three nozzles of the print head, then the nozzle control values for these nozzles are obtained from the arrays of bits that store the special print patterns (e.g., the special print patterns can be specified using the pocket printing graphical interface 253 and the "Save+Use String" button under the "Special Strings for the first 3 Active Nozzles and the Last 3 Active Nozzles" section). For the averaging function, if specific print patterns are specified for the different effective groups of nozzles, then the nozzle control values for these nozzles are obtained from the arrays of bits in "String1", "String2", and "String3" (e.g., the print patterns indicated within "String1", "String2", and "String3" are specified using the pocket printing graphical interface 253 and the "Save+Use String" button).

Figure 5B:
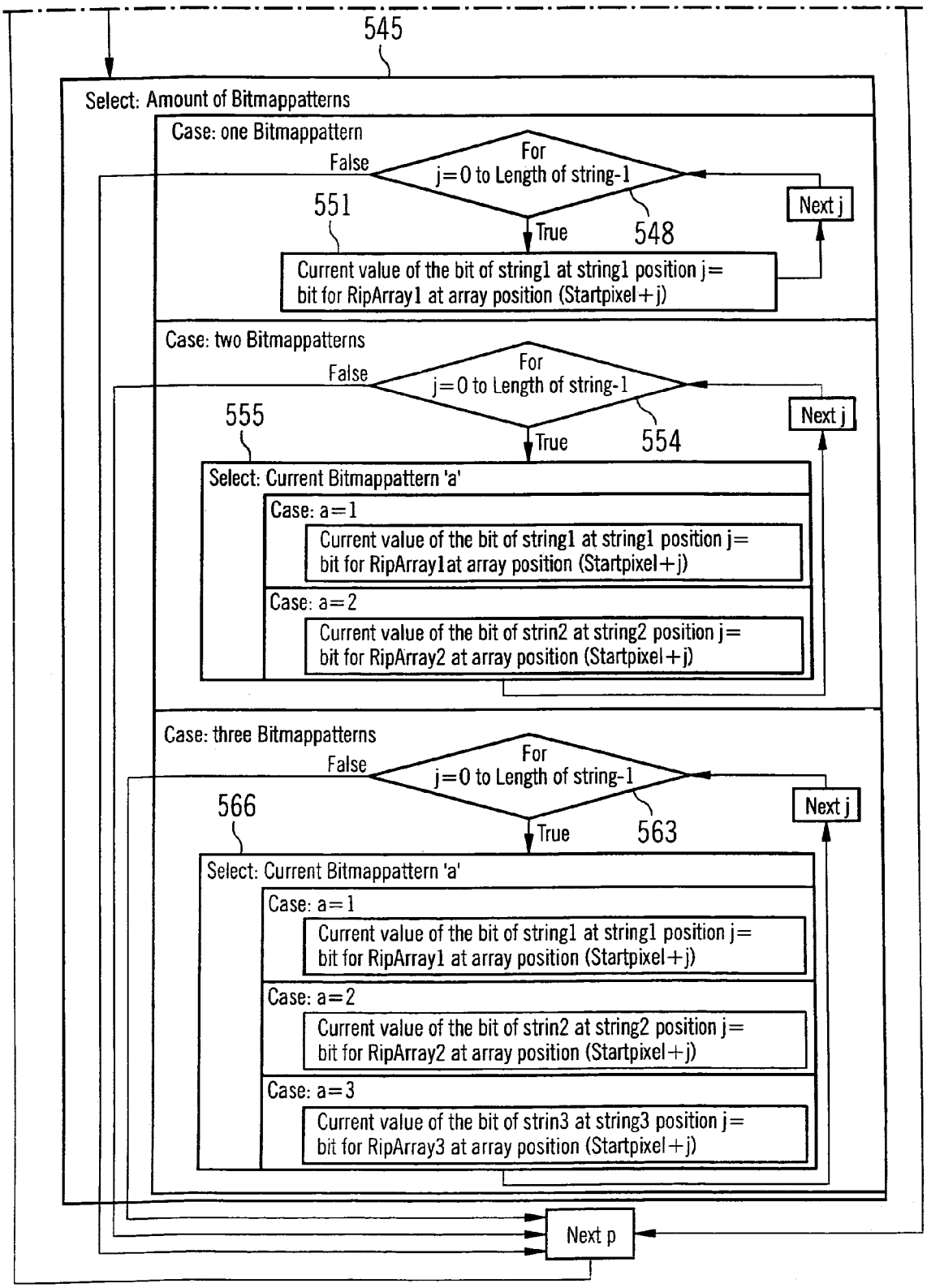
FIG. 5 shows an embodiment of a process to generate one or more bitmaps to control the active nozzles according to the present invention.

FIG. 5 shows an embodiment of a process to generate one or more bitmaps to control the active nozzles according to the present invention. The bitmaps include nozzle control values. The nozzle control values for each active nozzle are sent to the print head 121 at the beginning of each swath. In conditional block 509, the steps between block 512 and block 566 are repeated for each one of the pockets of a line printed by a particular one of the active nozzles (e.g., the particular active nozzle is designated by the variable "i" in FIG. 5). In block 512, for the particular one of the active nozzles (e.g., the current active nozzle is referred to as the particular one of the active nozzles), an offset to the starting position of the first pocket of the line is calculated. The starting position is the first encoder step that is inside the pocket. Each of the nozzles has a different offset to the starting position of its first pocket because of the rotation of the print head 121. The print head 121 is rotated such that the pitch between two adjacent nozzles matches the line pitch 224. In conditional block 515, it is determined whether the calculated starting position is for the first pocket of the line. If the starting position is not for the first pocket, then in block 518, the calculated starting position for the pocket (e.g., this pocket is not the first pocket of the line) is incremented by one encoder step so that the starting position is the first encoder step within the pocket.

In block 521, it is determined if the particular one of the active nozzle (the variable "i" represent the particular one of the active nozzles) is one of the first three active nozzles of the print head 121. If it is one of the first three active nozzles, then in block 524, a first variable (e.g., "SNozzleNumber") is set so that later references using this variable are to the print patterns specified for the first three nozzles of the print head 121.

In block 527, it is determined if the particular one of the active nozzle is one of the last three active nozzles of the print head 121. If it is one of the last three active nozzles, then in block 530, the first variable (e.g., "SNozzleNumber") is set so that later references using this variable are to the print patterns specified for the last three nozzles of the print head 121.

In block 533, it is determined if the particular one of the active nozzles is one of the first three nozzles or one of the last three nozzles of the print head 121 and if the operator has specified a special pattern for these nozzles. If it is one of these nozzles and the operator has specified a special pattern, then conditional block 536 repeats block 539 so that the special print pattern specified by the operator for that nozzle is copied to a bitmap (e.g., the bitmap specifies the patterns to be printed by the effective groups of nozzles during a print cycle). If, however, the particular nozzle is not one of the first three nozzles or the last three nozzles of the print head 121 or a special pattern is not specified for that nozzle, then in block 545, one or more of the possible print patterns are stored in the corresponding one or more bitmaps (e.g., RipArrays). If the averaging function is not activated, then in a block 548, a loop is performed to copy the common pattern (e.g., the pattern stored in "string 1") to the first bitmap (e.g., RipArray1) for the current nozzle (e.g., the current nozzle is specified by the variable "i"; in this case, only one bitmap is used since averaging is deactivated). In a block 551 the common print pattern (e.g., the pattern stored in "string 1") is copied to the first bitmap (e.g., this bitmap is represented by RipArray1 and RipArray1 is indexed using the nozzle number (e.g., the value of the variable "i") and the encoder step (e.g., the value of the variable "j")). The RipArrays contains one bitmap that is printed when using the "Averaging" feature. If, however, averaging is activated, then a particular nozzle prints one of two or three different common print patterns.

If there are two different common print patterns specified by the operator, then in a block 554, the appropriate one of the two common print patterns (e.g., the appropriate common print pattern is specified by the variable "a") is copied to the corresponding bitmap (e.g., RipArray1 or RipArray2). In a block 555, either the common print pattern for the first effective group of nozzles (e.g., the pattern stored in "string 1") or the common print pattern for the second effective group of nozzles (e.g., the pattern stored in "string 2") is copied to the corresponding bitmap (e.g., RipArray1 is filled with the print pattern stored in "string1" or RipArray2 is filled with the print pattern stored in "string2").

If there are three different patterns specified by the operator, then in block 563, the appropriate one of the three common print patterns is copied to the corresponding bitmap (e.g., RipArray1, RipArray2, or RipArray3). In a block 566, the common print pattern for the first effective group of nozzles (e.g., the pattern stored in "string 1"), the common print pattern for the second effective group of nozzles (e.g., the pattern stored in "string 2"), or the common print pattern for the third effective group of nozzles (e.g., the pattern stored in "string 3") is copied to the corresponding bitmap (e.g., RipArray1, RipArray2, or RipArray3). Then, blocks 512-566 are repeated for the next pocket, if any, of the line printed by the particular nozzle.

The process shown in FIG. 5 is repeated for each of the active nozzles in order to specify the patterns that these nozzles should print into each of the pockets of the lines. The patterns that the active nozzles should print are sent to the print head 121 at the beginning of each swath.

II. Averaging

"Averaging" pertains to having two or more different nozzles release droplets of organic material into the same pocket (i.e., print into the same pocket). When two or more different nozzles print each pocket, the differences in the amount of organic material released by different nozzles is averaged thus creating more uniformity in the brightness of each pixel (i.e., pocket) of the display. Also, different nozzles print into each pocket at each phase before the organic material dries thus allowing the droplets to combine to form a homogeneous film rather than drying and forming multiple layers of organic material. Also, by allowing effective groups of nozzles to print different patterns (e.g., the print pattern printed by one effective group of nozzles can differ from the print pattern printed by another effective group of nozzles), the differences in the amounts of organic material released by different nozzles can be compensated thus allowing for greater uniformity in the brightness of the pixels. In addition, by allowing the print pattern for the first three nozzles and the last three nozzles of the print head to be individually configurable (e.g., the print pattern for these nozzles can be specified using the pocket printing graphical interface 253), compensation can be made for the differences in the amount of organic material released by different nozzles due to, for example, print head characteristics such as the proximity of the nozzle to the point on the print head 121 at which the organic material enters.

If the averaging function is activated, then at the beginning of each swath, values are determined such as the starting position of the first line of the first swath (e.g., the starting position of the first line of the first swath can be the first encoder step inside the first pocket of the first line), whether nozzles are activated or deactivated, and the print pattern for the nozzles.

The starting position of the first line of the first swath (i.e., DisplayCornerYa) is calculated using:

$$\text{DisplayCornerYa}=\text{NewFid1Y}+\text{mm\_PlsY}(\text{Disp1PPy}+\\ (((\text{RowPitch}/\text{NumPhases})*(((\text{TotalNumNozzles}-\\ 1)/2)-\text{FirstActNzl})))-(\text{EffectiveNozzles}*(\text{AverageAmount}-1))*\text{RowPitch}),$$

where:

"NewFid1Y" is the position of a fiducial mark on the substrate that is obtained by image recognition software;

"mm_PlsY" is a function that converts the length in millimeters to the number of encoder pulses;

"Disp1PPy" is the offset between the camera that recognizes the fiducial mark and the middle nozzle on the print head;

"(((RowPitch/NumPhases)*(((TotalNumNozzles−1)/2)−FirstActNzl)))" calculates the distance from the middle nozzle to the first active nozzle;

"NumPhases" is the number of phases on the print head 121 (e.g., a print head by the Massachusetts Institute of Technology ("MIT") uses three phases to print the entire display because its electrical and physical structures limit it such that only every third nozzle is used for printing);

"TotalNumNozzles" is the total number of nozzles on the print head 121;

"FirstActNzl" is a first active nozzle on the print head 121 (this value is specified by the operator);

"(EffectiveNozzles*(AverageAmount−1))*RowPitch" calculates the offset for "averaging" for the first swath, because only some portion of the nozzles are over the display when printing the first swath;

"EffectiveNozzles" (the effective number of nozzles) is the number of nozzles that print into empty lines at each swath (the nozzles in one effective group of nozzles prints the same bitmap pattern);

"AverageAmount" is the number of different nozzles that print into the same pocket; and "RowPitch" is a distance between two adjacent lines that are printed during one swath.

If the averaging function is activated, then the total number of swathes used to print the display 133 (i.e., NumSwathsPerDisp) is calculated using:

$$\text{NumSwathsPerDisp}=\text{Round}((((\text{RowsInDisp}+\text{EffectiveNozzles}*(\text{AverageAmount}-1))/\text{EffectiveNozzles})+0.49),0),$$

where

"RowsInDisp" is the number of lines (i.e., rows) in a display; this value is specified by the operator;

"EffectiveNozzles*(AverageAmount−1)" is the additional swathes used to complete printing of the display since at the beginning not all nozzles are used to print the display; and "EffectiveNozzles" is the number of nozzles that print into empty lines during a first swath; and "0.49" is used to round up the result.

If the averaging and the three phase functions are activated, then the total number of swathes used to print the display 133 (i.e., NumSwathsPerDisp) is calculated using:

NumSwathsPerDisp=NumSwathsPerDisp+1;

One is added to the "NumSwathsPerDisp" calculated earlier since one extra swath is used to print the display when both the averaging and the three phase functions are activated.

If neither averaging nor the three phase function is activated, then the total number of swathes used to print the display 133 (i.e., NumSwathsPerDisp) is calculated using:

NumSwathsPerDisp=Round(((RowsInDisp/NumActiveNozzles)+0.49), 0), where:

"RowsInDisp" is the number of lines (i.e., rows) in a display; this value is specified by the operator; and "NumActiveNozzles" is the number of active nozzles on the print head 121.

Figure 6A:
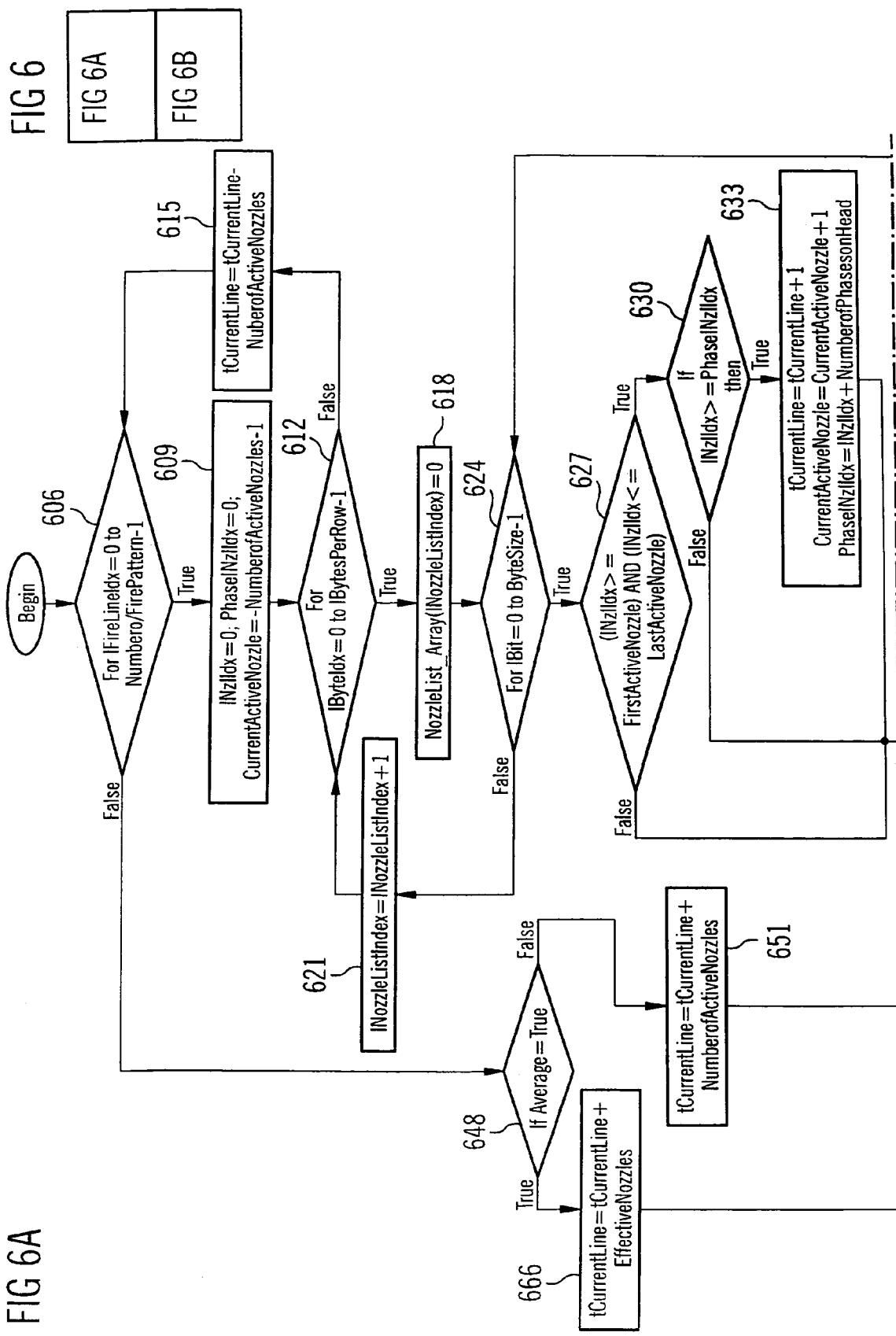
FIG. 6 shows an embodiment of a process for averaging according to the present invention.
Figure 6B:
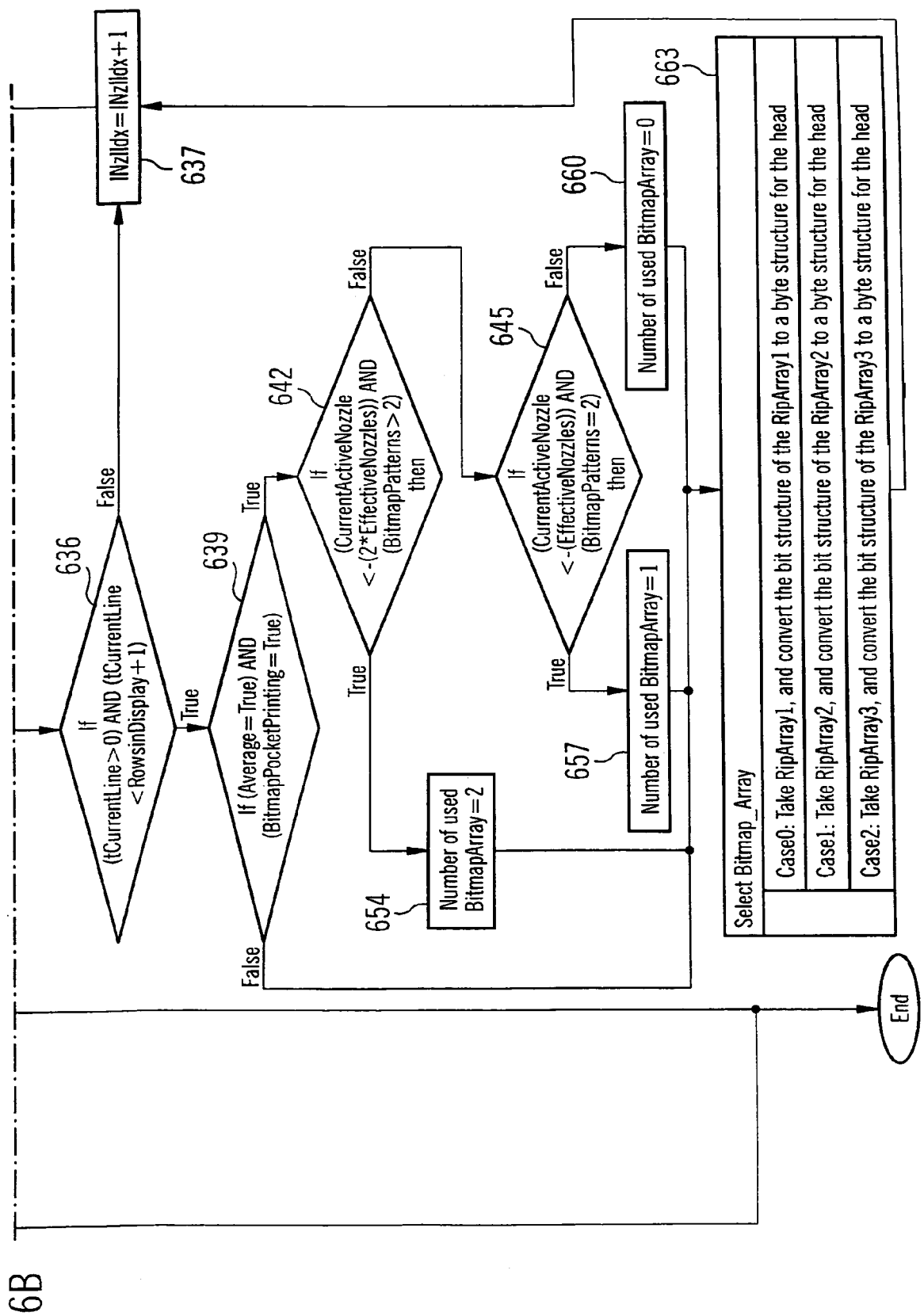

FIG. 6 shows an embodiment of a process for averaging according to the present invention. At the beginning of each new swath, this process is performed for each of the pockets of the lines that are to be printed during that swath using the nozzles of the print head 121. In conditional block 606, the block 609 to block 663 are repeated (i.e., looped) for each of the encoder steps within the pockets that the nozzles of the print head 121 are to print. In block 609, at the beginning of each new encoder step, the variables used during the averaging function are initialized. The variable "lNzlIdx" stores the number of the current nozzle being processed. This variable is used to traverse all of the nozzles of the print head 121 at one encoder step. In block 609, this variable is set to zero. The variable "PhaselNzlIdx" stores the correction for print heads whose adjacent nozzles cannot be used for printing (e.g., phased print heads such as the MIT print heads). In block 609, this variable is set to zero. The variable "CurrentActiveNozzle" stores the number of the nozzle on the print head 121 that is currently being processed within the loop. In conditional block 612, the blocks 618 to the block 663 are repeated the following number of times: the number of lines divided by eight. This number of repetitions occurs because the control values that specify whether the nozzles of the print head 121 are to release droplets at the particular encoder step are sent to the print head 121 in a byte format. In block 618, the "NozzleList_Array" is set to receive the next byte value and the value at position is set to zero. The "NozzleList_Array" stores bytes and each of these bytes specify whether a group of eight nozzles releases a droplet at a particular encoder step.

In conditional block 624, the block 627 to block 663 are repeated "ByteSize" (e.g., eight) times in order to send control values to the print head 121 in a byte format. Once the conditional block 624 completes, the block 621 increments "iNozzleListindex" to process the next set of nozzles (e.g., each set includes eight nozzles) on the print head 121. In conditional block 627, it is checked whether the current nozzle (e.g., the current nozzle is specified by the variable "NzlIdx") is one of the active nozzles (e.g., the active nozzles are used for printing during this swath). The variable "FirstActiveNozzle" is the number of the first active nozzle on the print head 121 and the variable "LastActiveNozzle" is the number of the last active nozzle on the print head 121. If the current nozzle is one of the active nozzles, then in conditional block 630, it is determined if one or more nozzles should be skipped to make corrections due to the print head's structure (e.g., a correction is made, for example, if only every third nozzle on the print head should be used for printing). The correction is made so that only the appropriate lines are printed during one cycle. If the current nozzle is used to print a line then in block 633, variables are set to indicate that the current nozzle is used for printing if the nozzle is within the boundaries of the display. In block 633, the number of nozzles to deactivate starting from the first active nozzle (e.g., the variable "tCurrentLine") is incremented by one. The tCurrentLine value is used to specify the nozzles that are within the display and are to be used for printing. Also, in this block it is indicated which active nozzle is processed (e.g., the variable "CurrentActiveNozzle" is incremented by one). In addition, if the print head has multiple phases, then the "PhaselNzlIdx" variable is set so that the tCurrentLine value and the CurrentActiveNozzle value are calculated correctly.

The variable "tCurrentLine" can be calculated using the following formula:

tCurrentLine=(EffectiveNozzles*(AverageAmount−1)), where:

"tCurrentLine" is the number of nozzles that are to be deactivated starting with the first active nozzle. By providing the number of nozzles that are to be deactivated, the variable "tCurrentLine" effectively specifies the number of effective groups of nozzles that are to be deactivated. This variable is used, for example, to deactivate nozzles that are outside the display or when the averaging function is activated since not all of the nozzles of the print head 121 may be used for printing during a swath;

"AverageAmount" is the number of different nozzles that print into the same pocket; and "EffectiveNozzles" is the number of nozzles that print into empty lines during the first swath; this is also the number of nozzles on the print head that print the same pattern.

In conditional block 636, it is determined if the current nozzle is over one of the lines of the display 133 (i.e., checks if the current nozzle is within the boundaries of the display 133). This occurs by checking if the current nozzle is to be activated (e.g., checking if "tCurrentLine>0") and by checking if the current nozzle is not past the end of the display (e.g., checking if "tCurrentLine<RowsInDisplay"). If the current nozzle is not over the lines of the display 133, then in block 637, the next nozzle on the print head 121 is processed (e.g., "lNzlIdx" is incremented by one). If, however, the current nozzle is over the lines of the display 133, then in conditional block 639, it is determined if the averaging function is activated (e.g., check if "Average" is True) and if the display is printed using the bit map pocket printing function (e.g., check if "BitmapPocketPrinting" is True). If both of these are activated, then in conditional block 642, it is determined if the current nozzle belongs to the third effective group of nozzles (e.g., check if "CurrentActiveNozzle<(2*EffectiveNozzles)") and if the averaging function is performed using more than two different common print patterns (e.g., check if Bitmap- Patterns>2; the variable "BitmapPatterns" specifies the number of different bitmap patterns to be used when performing the averaging function).

If the current nozzle belongs to the third effective group and the averaging function is performed using three common print patterns, then in block 654, it is specified that the third bitmap (e.g., RipArray3) is filled using the common print pattern for the third effective group of nozzles (e.g., this common print pattern is specified in "string 3"; this specification is made by setting "Number of used BitmapArray" to two). If, however, the current nozzle does not belong to the third effective group or the averaging function is not performed using three different common patterns, then in conditional block 645, it is determined if the current nozzle belongs to the second effective group of nozzles (e.g., check if "CurrentActiveNozzle<EffectiveNozzles") and if the averaging function is performed using two different common print patterns (e.g., check if "BitmapPatterns=2"; the variable "BitmapPatterns" specifies the number of different bitmap patterns to be used when performing the averaging function).

If the current nozzle belongs to the second effective group and the averaging function is performed using two common patterns, then in block 657, it is specified that the second bitmap (e.g., RipArray2) is filled using the common print pattern for the second effective group of nozzles (e.g., this common print pattern is specified in "string 2"; this specification is made by setting "Number of used BitmapArray" to one). If, however, the current nozzle does not belong to the second effective group or the averaging function is not performed using two different common patterns, then in conditional block 660, it is specified that the first bitmap (e.g., RipArray1) is filled using the common print pattern for the first effective group of nozzles (e.g., this common print pattern is specified in "string 1"; this specification is made by setting "Number of used BitmapArray" to zero).

In block 663, the appropriate common print pattern is selected for the current nozzle based on the specifications made in blocks 654, 657, and 660 (e.g., the selection is made using the variable "Number of used Bitmap Array"). If the current nozzle is to print the common print pattern for the first effective group of nozzles, then the nozzle control value indicating whether a droplet is to be released at the current encoder step (e.g., this value is a bit and is stored in the RipArray 1) is copied to a string that stores nozzle control values in a byte format (e.g., NozzleList_Array). If the current nozzle is to print the common print pattern for the second effective group of nozzles, then the nozzle control value for this pattern (e.g., this value is a bit that is stored in the RipArray 2) is copied to the string that stores nozzle control values in the byte format (e.g., NozzleList_Array). If the current nozzle is to print the common print pattern for the third effective group of nozzles, then the nozzle control value for this pattern (e.g., this value is a bit that is stored in the RipArray 3) is copied to the string that stores nozzle control values in the byte format (e.g., NozzleList_Array). Once a byte of nozzle control values are stored, this string is sent to the print head 121.

After the last encoder step of the swath is processed, in conditional block 648, it is determined if the averaging function is activated. If the averaging function is activated, then in block 666, the number of nozzles to be deactivated (e.g., the variable "tCurrentLine") is decremented by the number of nozzles in each effective group (e.g., the variable "EffectiveNozzles"). If, however, the averaging function is deactivated, then in block 651, the number of nozzles to be deactivated (e.g., the variable "tCurrentLine") is decremented by the number of active nozzles on the print head 121 (e.g., the variable "NumberofActiveNozzles"). This updated value for the number of nozzles to be deactivated is calculated for use during the next swath.

When the averaging function is activated and one swath completes, in order to begin the next swath, the x-y stage 106 is moved to the starting position of this next swath. The starting position is calculated using:

$$DisplayCornerYa = oldDisplayCornerYa + (mm\_PlsY(ShiftAverage)),$$

where,

"oldDisplayCornerYa" is the starting position of the previous swath;

"mm_PlsY" is a function that converts the length in millimeters to the number of encoder pulses; and "ShiftAverage" is the distance the y stage moves for each new swath. The "ShiftAverage" is calculated using:

$$ShiftAverage = EffectiveNozzles * RowPitch.$$

If there are multiple displays on the substrate 109, then the distance to the starting point of the first pocket of the first line of the first phase of the next display is calculated using:

$$DisplayCornerYa = DistBtwDispColsA + oldDisplayCornerYa,$$

where,

"oldDisplayCornerYa" stores the starting position of the previous adjacent display; and "DistBtwDispColsA" stores the distance in the y-direction between two adjacent displays.

FIG. 7 shows an example of printing a display using averaging according to an embodiment of the present invention. In FIG. 7, the display has fifty lines, the print head has fifteen nozzles, the number of nozzles in each effective group of nozzles is five (i.e., the effective number of nozzles is five; the effective number of nozzles is the number of nozzles that print into empty lines during a swath), and the number of different nozzles that print into each pocket for averaging is three. During the first swath, one effective group of nozzles (e.g., this group includes nozzles 11-15) prints a subset of the lines on the display 133 (e.g., the subset of the lines includes lines 1-5). During the first swath, nozzle 11 prints line 1, nozzle 12 prints line 2, nozzle 13 prints line 3, nozzle 14 prints line 4 and nozzle 15 prints line 5. Nozzles 11-15 can be considered to be one effective set of nozzles. During this swath, the nozzles 1-10 of the print head are deactivated.

For the second swath, the print head is moved to the right by a distance equal to the effective number of nozzles times the row pitch and another group of nozzles are activated (i.e., for the second swatch, two effective sets of nozzles are activated: nozzles 11-15 are one effective set of nozzles and nozzles 6-11 are another effective set of nozzles). During the second swath, nozzle 6 prints line 1, nozzle 7 prints line 2, nozzle 8 prints line 3, nozzle 9 prints line 4, nozzle 10 prints line 5, nozzle 11 prints line 6, nozzle 12 prints line 7, nozzle 13 prints line 8, nozzle 14 prints line 9, and nozzle 15 prints line 10. During this swath, the nozzles 1-5 are deactivated.

During the third swath, nozzle I prints line 1, nozzle 2 prints line 2, nozzle 3 prints line 3, nozzle 4 prints line 4, nozzle 5 prints line 5, nozzle 6 prints line 6, nozzle 7 prints line 7, nozzle 8 prints line 8, nozzle 9 prints line 9, nozzle 10 prints line 10, nozzle 11 prints line 11, nozzle 12 prints line 12, nozzle 13 prints line 13, nozzle 14 prints line 14 and nozzle 15 prints line 15. During this swath, all the nozzles are activated. Upon completion of this swath, the printing of lines 1-5 is complete and each of these lines has been printed using three different nozzles. Because each of these lines was printed using three different nozzles, the amount of organic material released into each of these pockets is more likely to be uniform (e.g., averaged) resulting in more uniform brightness of the pixels. During this swath, the pattern printed by the first set of effective nozzles (e.g., nozzles 11-15) can be individually configured; the pattern printed by the second effective group of nozzles (e.g., nozzles 6-10) can be individually configured; and the pattern printed by the third effective group of nozzles (e.g., nozzles 1-5) can be individually configured. That is, the common pattern printed by each of these different sets of effective nozzles can be different. Also, the pattern printed by the first three nozzles of the print head (i.e., nozzles 1-3) and the last three nozzles of the print head (i.e., nozzles 11-15) can be individually configured; i.e., the pattern printed by these nozzles can be different from each other and different than the common patterns. The common pattern for each of the different sets of effective nozzles and the special pattern for the first three and the last three nozzles can be specified using the pocket printing graphical interface 253.

During the fourth swath, nozzle 1 prints line 6, nozzle 2 prints line 7, nozzle 3 prints line 8, nozzle 4 prints line 9, nozzle 5 prints line 10, nozzle 6 prints line 11, nozzle 7 prints line 12, nozzle 8 prints line 13, nozzle 9 prints line 14, nozzle 10 prints line 15, nozzle 11 prints line 16, nozzle 12 prints line 17, nozzle 13 prints line 18, nozzle 14 prints line 19 and nozzle 15 prints line 20. During this swath, all the nozzles are activated. After this swath, the printing of lines 6-10 is complete and each of these lines has been printed using three different nozzles. This continues until the twelfth swath where nozzle 1 prints line 46, nozzle 2 prints line 47, nozzle 3 prints line 48, nozzle 4 prints line 49, and nozzle 5 prints line 50. In this swath, nozzles 6-15 are deactivated. At the completion of this swath, the printing of lines 46-50 is complete. Also, the printing of the display is complete and each of the pixels (i.e., pockets) has been printed using three different nozzles.

III. Three-Phase Printing

Because of errors resulting from a large rotation of the print head, adjacent nozzles are not typically used to print adjacent lines, therefore, several phases are used to print all of the pockets of the display. By automatically performing the printing of the several phases, the elapsed time to print all of the pockets of the display is reduced and there is also a reduction in the operator's time expended to print all of the pockets. Also, when printing a color display, if each of the three adjacent lines in a group are printed with different nozzles, the differences in the amount of organic material dispensed by the nozzles and the resulting differences in the brightness of the pixels of the lines are randomly dispersed throughout the display resulting in a higher quality display. By printing different lines of the group with different nozzles, the visible distinction between swathes is reduced.

FIG. 8 shows an embodiment of a process for three-phase printing according to the present invention. In conditional block 707, it is determined if the averaging function is activated. If the averaging function is not activated, then in block 710, the starting position of the first line at which the first nozzle is to be positioned is calculated according to the earlier description to calculate the starting position of the first line of the first swath (i.e., DisplayCornerYa). In block 713, the number of different iterations used to print the entire display is set to one (e.g., the variable "PhaseNumAmount" is set to zero). If, however, the averaging function is activated, then in block 714, it is determined if the three-phase printing function is activated. If the three-phase printing is not activated, then in block 716, the starting position of the first line is calculated such that the first nozzle of the first effective group of nozzles is over the starting position. This starting position is calculated as described earlier to calculate the starting position of the first line of the first swath (e.g., "DisplayCornerYa"). In block 719, the number of different iterations used to print the entire display is set to one (e.g., the variable "PhaseNumAmount" is set to zero).

If the three-phase printing is activated, then in block 722, the starting positions for three adjacent lines within the first group of lines is calculated such that each of the three adjacent lines is printed at different phases using different nozzles. The starting position of the first line printed during the first phase (e.g., the starting position of the first line of the first group) is calculated according to the earlier description to calculate the starting position of the first line of the first swath (e.g., refer to the earlier description for calculating "DisplayCornerYa"). The starting position of the first line printed during the second phase such that it is printed with a different nozzle than that used to print the first line of the first phase is calculated using ("DisplayCornerYa_Phase2" ensures that the first line of the second phase is printed with a different nozzle than the first line of the first phase):

$$DisplayCornerYa\_Phase2 = DisplayCornerYa - ShiftPerPhase,$$

where:

$$ShiftPerPhase = mm\_PlsY(Fix(EffectiveNozzles/3) * RowPitch - RowPitch/3),$$

where:

"ShiftPerPhase" is the distance in encoder pulses that the print head 121 is to be shifted so that a different nozzle is printing the first line of a different phase;

"mm_PlsY" is a function to convert the length in millimeters to encoder pulses;

"Fix" is a function to obtain the integer number without rounding;

"(EffectiveNozzles/3)*RowPitch" calculates a different nozzle to print the next phase. The effective number of nozzles is divided by 3 since every third line is printed; and "RowPitch/3" moves the x-y stage 106 so that the different nozzle is over the first line of a different phase.

The starting position of the first line printed during the third phase such that it is printed with a different nozzle than that used to print the first line of the first phase and the first line of the second phase is calculated using:

$$DisplayCornerYa\_Phase3 = DisplayCornerYa - ShiftPerPhase*2.$$

In block 725, the number of different iterations used to print the entire display is set to three (e.g., the variable "PhaseNumAmount" is set to two).

In conditional block 728, for each of the displays on the substrate 109, block 731 to block 770 are repeated. For example, the number of displays on the substrate 109 is specified by the variable "NumDisplayCols". In conditional block 731, for each of the iterations used to print the entire display, block 737 to block 770 are repeated. In conditional block 737, it is checked if the averaging function is activated. If the averaging function is activated, then in block 743, for the first print phase, the number of nozzles that are to be deactivated starting with the first active nozzle is calculated according to the earlier description for calculating this number (i.e., refer to the earlier description for calculating "tCurrentLine"). The nozzles that are not over the display during the first swath are deactivated.

In conditional block 746, it is determined if the three-phase printing function is activated. If it is activated, then in conditional block 749, it is determined if this is the first iteration (e.g., this determination occurs by checking if "sPhase=0"). If it is the first iteration, then in block 752, the number of nozzles to be deactivated during the third print phase is calculated using:

tCurrentLine=old-tCurrentLine−Fix(EffectiveNozzles/3)*2, where:

"old-tCurrentLine" is the number of nozzles that are deactivated during the first print phase as calculated earlier in block 743.

Also, the starting position of the first line printed during the third print phase is the starting position calculated earlier in block 722.

If it is not the first iteration, then in conditional block 755, it is determined if this is the second iteration (e.g., this determination occurs by checking if "sPhase=1"). If it is the second iteration, then in block 758, the number of nozzles that are to be deactivated during the first swatch of the second print phase is calculated using:

tCurrentLine=old−tCurrentLine−Fix(EffectiveNozzles/3), where:

"old-tCurrentLine" is the number of nozzles that are deactivated during the first print phase as calculated earlier in block 743.

In block 758, the starting position of the first line printed during the second phase is set to the starting position calculated earlier in block 722.

In conditional block 755, if it is determined that the current iteration is not the second iteration, then in conditional block 761, it is determined if the current iteration is the third iteration (e.g., this determination occurs by checking if "sPhase=2"). If it is the third iteration, then in block 764, the number of nozzles that are to be deactivated during the first print phase is the number of nozzles to be deactivated calculated earlier in block 743. In block 764, the starting position of the first line printed during the first print phase is set to the starting position calculated earlier in block 722.

In block 737, if it is determined that the averaging function is not activated, then in block 740, none of the nozzles of the print head 121 are deactivated (e.g., all of the nozzles are activated by setting "tCurrentLine" to zero). In block 767, the x-y stage 106 is moved to the starting position for the current phase that was calculated earlier (e.g., the starting position for the current phase is stored in any one of "DisplayCornerYa", "DisplayCornerYa_Phase2", or "DisplayCornerYa_Phase3") and the number of nozzles that are to be deactivated during the current phase as calculated earlier are deactivated (e.g., the number of nozzles to be deactivated during the current phase is stored in "tCurrentLine").

In block 770, one phase of printing of the display 133 is performed. In each swath of the current phase, the print head 121 is moved in the y-direction by the distance specified by "ShiftAverage" (as described earlier, ShiftAverage=EffectiveNozzles*RowPitch). After the one or more print phases complete, in block 734, a starting position of the next display is calculated. In conditional block 728, it is determined if all of the displays on the substrate 109 have been printed and if this has occurred, then the three-phase printing function completes.

FIGS. 9*a-b* shows an example of printing a display using three-phase printing according to an embodiment of the present invention. With three-phase printing, at the beginning of each phase, a different nozzle is used to print the first line of the lines printed during that phase. In FIG. 9*a*, the display has fifty lines, the print head has forty-five nozzles, the effective number of nozzles is fifteen, the number of different nozzles that print into each pocket for averaging is three, and the number of phases used to print all of the lines of the display is three.

During the first swath of the third print phase (i.e., the first iteration), nozzle 15 prints line 3. During this first swath, nozzles 1 to 14 are deactivated. After completion of the first swath, the print head is moved over to the right by the effective number of nozzles. During the second swath of phase 3, nozzle 10 prints line 3, nozzle 11 prints line 6, nozzle 12 prints line 9, nozzle 13 prints line 12, nozzle 14 prints line 15 and nozzle 15 prints line 18. During this swath, nozzles 1 to 9 are deactivated. As shown in FIG. 9*a*, this printing continues until the sixth swath when nozzle 1 prints line 36, nozzle 2 prints line 39, nozzle 3 prints line 42, nozzle 4 prints line 45 and nozzle 5 prints line 48.

For the second print phase (i.e., the second iteration), a different nozzle is used to print the first line printed during this second phase than the nozzle used to print the first line printed during the third phase (e.g., during the third phase, the first line printed, i.e. line 3, is printed using nozzle 15). During the first swath of the second print phase, nozzle 13 prints line 2, nozzle 14 prints line 5, and nozzle 15 prints line 8. During this first swath of phase 2, nozzles 1 to 12 are deactivated. After completion of the first swath, the print head is moved over to the right by the effective number of nozzles. During the second swath of the second print phase, nozzle 8 prints line 2, nozzle 9 prints line 5, nozzle 10 prints line 8, nozzle 11 prints line 11, nozzle 12 prints line 14, nozzle 13 prints line 17, nozzle 14 prints line 20, and nozzle 15 prints line 23. During the second swath, nozzles 1 to 7 are deactivated. As shown in FIG. 9*a*, this printing continues until the sixth swath when nozzle 1 prints line 41, nozzle 2 prints line 44, nozzle 3 prints line 47 and nozzle 4 prints line 50.

For the first print phase (i.e., the third iteration), a different nozzle is used to print the first line printed during this first phase than the nozzles used to print the first line printed during the third phase and the first line printed during the second phase. During the first swath the first print phase (i.e., the third iteration), nozzle 11 prints line 1, nozzle 12 prints line 4, nozzle 13 prints line 7, nozzle 14 prints line 10, and nozzle 15 prints line 13. During this first swath, nozzles 1-10 are deactivated. After completion of the first swath, the print head is moved over to the right by the effective number of nozzles. During the second swath of the first print phase, nozzle 6 prints line 1, nozzle 7 prints line 4, nozzle 8 prints line 7, nozzle 9 prints line 10, and nozzle 10 prints line 13, nozzle 11 prints line 16, nozzle 12 prints line 19, nozzle 13 prints line 22, nozzle 14 prints line 25, and nozzle 15 prints line 28. During the second swath, nozzles 1-5 are deactivated. As shown in FIG. 9, this printing continues until the sixth swath when nozzle 1 prints line 46 and nozzle 2 prints line 49.

When the sixth swath of the first phase completes, all of the pixels of the color display have been printed with three different nozzles and each of the first lines printed during the three different phases are printed using different nozzle. FIG. 9*b* shows the resulting display after all these three print phases are performed.

As any person of ordinary skill in the art of computer programming with familiarity with ink-jet printing technology will recognize from the description, figures, and examples that modifications and changes can be made to the embodiments of the invention without departing from the scope of the invention defined by the following claims.

What is claimed:

1. A computer-based method to graphically specify at least one encoder line of each at least one pocket at which at least one nozzle of a print head is to release a droplet of an organic material, comprising:
    displaying on a display device a graphical pocket representation of a particular one of said at least one pocket, wherein said graphical pocket representation includes at least one graphical encoder line and said at least one graphical encoder line corresponds to at least one encoder step of said particular pocket;
    receiving a particular one of at least one received graphical encoder line, said at least one received graphical encoder line is a subset of said at least one graphical encoder line;
    displaying a graphical droplet at or erasing a graphical droplet from said particular received graphical encoder line; and
    generating at least one nozzle control value using said at least one received graphical encoder line, wherein said at least one nozzle control value specifies whether corresponding said at least one nozzle releases said droplet of said organic material.

2. The method of claim 1 wherein displaying said graphical pocket representation on said display device includes:
    drawing a first circle, wherein a left-most point on a circumference of said first circle is a first circle starting value and said first circle has a diameter specified by a line pitch value;
    drawing a first line that is connected at one end to a top-most point on said circumference of said first circle, said first line having a length equal to a pixel length value minus said line pitch value;
    drawing a second line that is connected at one end to a bottom-most point on said circumference of said first circle, said second line having a length equal to said pixel length value minus said line pitch value;
    drawing a second circle, wherein a right-most point on a circumference of said second circle is said pixel length value away from said left-most point on said circumference of said first circle, said second circle has a diameter specified by said line pitch value, wherein another end of said first line is connected to a top-most point on said circumference of said second circle, and another end of said second line is connected to a bottom-most point on said circumference of said second circle; and
    drawing a closed geometrical figure that has a color approximately equal to a color of a background of said display device, said closed geometrical figure covers approximately all of said first line and said second line and covers approximately all of an inner half of said first circle and an inner half of said second circle.

3. The method of claim 2 wherein said closed geometrical figure has a top side that has at length equal to said first line and a bottom side that has a length equal to said second line.

4. The method of claim 2 wherein displaying said graphical pocket representation on said display device includes:
    drawing a first one of said at least one graphical encoder line at a left-most point on said circumference of said first circle; and
    drawing a second one of said at least one graphical encoder line such that there is an encoder divider distance between said first one of said at least one graphical encoder line and said second one of said at least one graphical encoder line,
    wherein each of said at least one graphical encoder lines is a vertical line.

5. The method of claim 4 wherein receiving said particular one of said at least one graphical encoder line includes:
    upon receiving a selection at a coordinate point, determining if said selected coordinate point is close to any one of said at least one graphical encoder lines; and
    if said selected coordinate point is close to any one of said at least one graphical encoder lines, determining if said particular received graphical encoder line that is close to one of said at least one graphical encoder lines is to have said graphical droplet displayed at or erased from said particular received encoder lines.

6. The method of claim 5 wherein said selected coordinate point is close to any one of said at least one graphical encoder line if said selected coordinate point is within approximately 0.4 millimeters from said one of said at least one graphical encoder line.

7. The method of claim 5 wherein determining if said graphical droplet is to be displayed at or erased from said particular received graphical encoder line includes:
    specifying that said graphical droplet is to be displayed at said particular received graphical encoder line if it was previously specified that said graphical droplet is not to be displayed at said particular received graphical encoder line; and
    specifying that said graphical droplet is not to be displayed at said particular received graphical encoder line if it was previously specified that said graphical droplet is to be displayed at said particular received graphical encoder line.

8. The method of claim 1 wherein displaying said graphical droplet at a particular one of said one or more received graphical encoder lines includes drawing a circle having a diameter specified by a drop diameter value, wherein said circle has a center on said particular one of said one or more received graphical encoder lines.

9. The method of claim 1 wherein said at least one received graphical encoder line forms a special print pattern for any one of: a first nozzle, a second nozzle, a third nozzle, a last nozzle, a second from said last nozzle, or a third from said last nozzle, and a particular one of said at least one nozzle control value corresponding to any one of said first nozzle, said second nozzle, said third nozzle, said last nozzle, said second from said last nozzle, or said third from said last nozzle for which said special print pattern was formed is generated using said special print pattern.

10. The method of claim 1 wherein said at least one received graphical encoder line forms a special print pattern for use during any one of: a first print phase, a second print phase, or a third print phase and a particular one of said at least one nozzle control value corresponding to any one of said at least one nozzle is generated using said special print pattern.

* * * * *

UNITED STATES PATENT AND TRADEMARK OFFICE
CERTIFICATE OF CORRECTION

PATENT NO. : 7,630,782 B2
APPLICATION NO. : 11/392353
DATED : December 8, 2009
INVENTOR(S) : Tobias Stadler It is certified that error appears in the above-identified patent and that said Letters Patent is hereby corrected as shown below:

On the Title Page, Item (73) Assignee, at Line 1, replace;

"Osram Opto Semiconductor GmbH" with
-- Osram Opto Semiconductors GmbH --

On the Title Page, Item (56) References Cited, Other Publications, at Line 6, replace;

"519-521, vol. 72, No. 5, American Institute of Physics,." with
-- 519-521, vol. 72, No. 5, American Institute of Physics. --

Column 21, Line 59 at Claim 3; replace:

"figure has a top side that has at length equal to said first line" with
-- figure has a top side that has a length equal to said first line --

Signed and Sealed this
Thirty-first Day of January, 2012

David J. Kappos
*Director of the United States Patent and Trademark Office*